(12) United States Patent
Shin et al.

(10) Patent No.: US 12,457,868 B2
(45) Date of Patent: Oct. 28, 2025

(54) DISPLAY APPARATUS AND METHOD OF MANUFACTURING THE SAME

(71) Applicant: SAMSUNG DISPLAY CO., LTD., Yongin-si (KR)

(72) Inventors: Junghoon Shin, Yongin-si (KR); Junwoo You, Yongin-si (KR); Taeoh Kim, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 449 days.

(21) Appl. No.: 17/990,433

(22) Filed: Nov. 18, 2022

(65) Prior Publication Data
US 2023/0269978 A1    Aug. 24, 2023

(30) Foreign Application Priority Data
Feb. 22, 2022    (KR) .................. 10-2022-0023131

(51) Int. Cl.
*H10K 59/131*  (2023.01)
*H10K 71/00*  (2023.01)
*H10K 59/12*  (2023.01)

(52) U.S. Cl.
CPC .......... *H10K 59/131* (2023.02); *H10K 71/00* (2023.02); *H10K 59/1201* (2023.02)

(58) Field of Classification Search
CPC .. H10K 59/131; H10K 59/1201; H05K 1/118; H05K 1/189; H05K 2203/107
See application file for complete search history.

(56) References Cited

U.S. PATENT DOCUMENTS

| | | |
|---|---|---|
| 2016/0091746 A1 | 3/2016 | Cho et al. |
| 2017/0188449 A1* | 6/2017 | Nakagawa .......... H05K 3/4007 |
| 2021/0043600 A1 | 2/2021 | Park et al. |
| 2021/0066434 A1 | 3/2021 | Lee |
| 2021/0125956 A1 | 4/2021 | Kim et al. |

FOREIGN PATENT DOCUMENTS

| | | |
|---|---|---|
| KR | 1019970018728 A | 4/1997 |
| KR | 20170133573 A | 12/2017 |
| KR | 102122067 B1 | 6/2020 |
| KR | 1020210005350 A | 1/2021 |
| KR | 102247998 B1 | 5/2021 |

* cited by examiner

*Primary Examiner* — Wasiul Haider
(74) *Attorney, Agent, or Firm* — CANTOR COLBURN LLP

(57) ABSTRACT

A display apparatus includes: a substrate including a display region and a non-display region outside the display region; a first line disposed on an upper surface of the substrate in the non-display region of the substrate, where the first line has a first height; a flexible printed circuit board; a second line disposed on a lower surface of the flexible printed circuit board, where the second line has a second height; and a connection line located in a portion in which the substrate and the flexible printed circuit board overlap each other and disposed between the substrate and the flexible printed circuit board, where in the connection lines has a third height greater than each of the first height and the second height, one end of the connection line is connected to the first line, and another end of the connection line is connected to the second line.

6 Claims, 14 Drawing Sheets

DISPLAY APPARATUS AND METHOD OF MANUFACTURING THE SAME

This application claims priority to Korean Patent Application No. 10-2022-0023131, filed on Feb. 22, 2022, and all the benefits accruing therefrom under 35 U.S.C. § 119, the content of which in its entirety is herein incorporated by reference.

BACKGROUND

1. Field

One or more embodiments relate to a display apparatus and a method of manufacturing the display apparatus, and more particularly, to a display apparatus in which a high-resolution image may be implemented, and a method of manufacturing the display apparatus.

2. Description of the Related Art

In general, a display apparatus includes a flexible printed circuit board. The flexible printed circuit board may be electrically connected to a display panel and transmit electrical signals to the display panel. In some cases, the flexible printed circuit board may electrically connect the display panel and a printed circuit board to each other. In such a display apparatus, a pad provided in the flexible printed circuit board and a pad provided in the display panel may be bonded to each other

SUMMARY

As the size of a pad and a pitch decreases according to the high resolution of a display apparatus, it is desired to more precisely adjust the positions of the flexible printed circuit board and the display panel to bond the flexible printed circuit board and the display panel together. In a conventional display apparatus, due to a high resolution thereof, a pad provided in a flexible printed circuit board and a pad provided in a display panel may not be accurately bonded to each other.

One or more embodiments include a display apparatus in which a high-resolution image may be implemented, and a method of manufacturing the display apparatus. However, the one or more embodiments are only examples, and the scope of the disclosure is not limited thereto.

According to an embodiment, a display apparatus includes a substrate including a display region and a non-display region outside the display region, a first line disposed on an upper surface of the substrate in the non-display region of the substrate, wherein the first line has a first height, a flexible printed circuit board, a second line disposed on a lower surface of the flexible printed circuit board, where the second line has a second height, and a connection line located in a portion in which the substrate and the flexible printed circuit board overlap each other, and disposed between the substrate and the flexible printed circuit board, where the connection line has a third height greater than each of the first height and the second height, one end of the connection line is connected to the first line, and another end of the connection line is connected to the second line.

In an embodiment, the third height may be less than a sum of the first height and the second height.

In an embodiment, an upper surface of the connection line may be in contact with the lower surface of the flexible printed circuit board.

In an embodiment, the upper surface of the connection line and an upper surface of the second line may be disposed on a same plane.

In an embodiment, the upper surface of the connection line and the upper surface of the second line may form a continuous surface.

In an embodiment, a lower surface of the connection line and a lower surface of the first line may be disposed on a same plane.

In an embodiment, the lower surface of the connection line and the lower surface of the first line may form a continuous surface.

In an embodiment, the first line, the second line, and the connection line may be integrally formed as a single and indivisible body.

In an embodiment, the flexible printed circuit board may have a first cut-out portion and a second cut-out portion, the first cut-out portion corresponding to one side of the connection line, and the second cut-out portion corresponding to another side of the connection line.

In an embodiment, each of the first cut-out portion and the second cut-out portion may extend in a direction in which the connection line extends.

In an embodiment, the first cut-out portion may expose one side surface of the connection line, and the second cut-out portion may expose another side surface of the connection line.

In an embodiment, a lower surface of the connection line may have a greater area than an area of an upper surface of the connection line.

In an embodiment, an upper surface of the connection line may have a greater area than an area of a lower surface of the connection line.

In an embodiment, a side surface of the connection line may include a bent surface.

According to an embodiment, a method of manufacturing a display apparatus includes preparing a display panel including a first line and a first integration pad, where the first line has a first height and is disposed on an upper surface of a substrate to be in a non-display region outside a display region of the substrate, and the first integration pad is connected to an end of the first line and has a width greater than a width of the first line, preparing a flexible printed circuit board including a second line on a lower surface thereof, where the second line has a second height, disposing the flexible printed circuit board and the substrate in a way such that an upper surface of the first integration pad and a lower surface of the second line are in contact with each other, bonding the first integration pad and the second line to each other, and forming, by radiating a laser beam onto the first integration pad, a first opening and a second opening through the first integration pad in a thickness direction to extend along one side of the second line and another side of the second line from a first end of the first integration pad in a direction to the first line to a second end of the first integration pad in a direction away from the first line.

In an embodiment, the first integration pad and the second line may be integrally formed as a single and indivisible body by the bonding.

According to an embodiment, a method of manufacturing a display apparatus includes preparing a display panel including a first line and a first integration pad, where the first line has a first height and is disposed on an upper surface of a substrate to be in a non-display region outside a display region of the substrate, and the first integration pad is connected to an end of the first line and has a width greater than a width of the first line, preparing a flexible printed circuit board including a second line and a second integration pad, where the second line is disposed on a lower surface of the flexible printed circuit board and has a second height, and the second integration pad is connected to an end of the second line and has a width greater than a width of the second line, disposing the flexible printed circuit board and the substrate in a way such that an upper surface of the first integration pad and a lower surface of the second integration pad are in contact with each other, bonding the first integration pad and the second integration pad to each other, and forming, by radiating a laser beam onto the first integration pad and the second integration pad, a first opening and a second opening through the first integration pad and the second integration pad in a thickness direction to extend from first ends of the first integration pad and the second integration pad in a direction to the first line to second ends of the first integration pad and the second integration pad in a direction to the second line, where portions of the first integration pad and the second integration pad between the first opening and the second opening connect the first line and the second line to each other.

In an embodiment, the first integration pad and the second integration pad may be integrally formed as a single and indivisible body by the bonding.

According to an embodiment, a method of manufacturing a display apparatus includes preparing a display panel including a first line on an upper surface of a substrate to be in a non-display region outside a display region of the substrate, where the first line has a first height, preparing a flexible printed circuit board including a second line and a second integration pad, wherein the second line is disposed on a lower surface of the flexible printed circuit board and has a second height, and the second integration pad is connected to an end of the second line and has a width greater than a width of the second line, disposing the flexible printed circuit board and the substrate in a way such that a lower surface of the second integration pad and an upper surface of the first line are in contact with each other, bonding the second integration pad and the first line to each other, and forming, by radiating a laser beam onto the second integration pad, a first opening and a second opening through the second integration pad in a thickness direction to extend along one side of the first line and another side of the first line from a second end of the second integration pad in a direction to the second line to a first end of the second integration pad in a direction away from the second line.

In an embodiment, the second integration pad and the first line may be integrally formed as a single and indivisible body by the bonding.

These and/or other features will become apparent and more readily appreciated from the following description of the embodiments, the claims, and the accompanying drawings.

BRIEF DESCRIPTION OF THE DRAWINGS

The above and other features of certain embodiments will be more apparent from the following description taken in conjunction with the accompanying drawings, in which.

DETAILED DESCRIPTION

Figure 1:
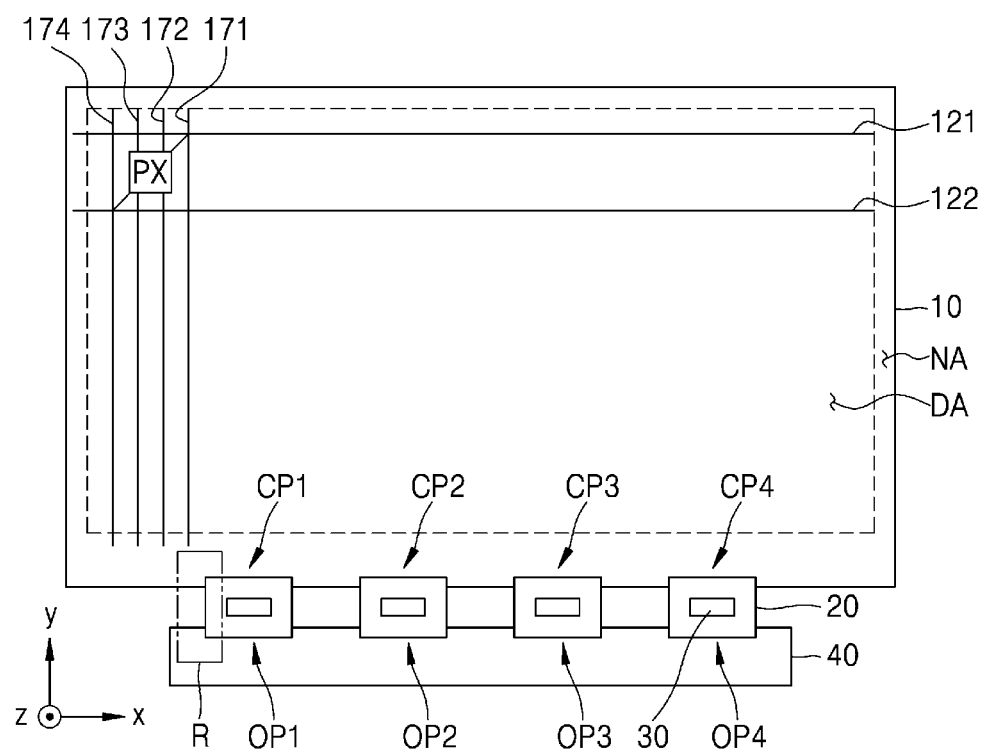
FIG. 1 is a plan view schematically illustrating a display apparatus according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. Throughout the disclosure, the expression "at least one of a, b, or c" or "at least one selected from a, b and c" indicates only a, only b, only c, both a and b, both a and c, both b and c, all of a, b, and c, or any variations thereof. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

It will be understood that when an element, such as a layer, a film, a region, or a plate, is referred to as being "on" another element, the element can be directly on the other element or intervening elements may be thereon. Sizes of elements in the drawings may be exaggerated or reduced for convenience of description. In other words, since sizes and thicknesses of elements in the drawings are arbitrarily illustrated for convenience of explanation, the following embodiments are not limited thereto.

In the following embodiments, an x-axis, a y-axis, and a z-axis are not limited to three axes of the rectangular coordinate system, and may be interpreted in a broader sense. For example, the x-axis, the y-axis, and the z-axis may be perpendicular to one another, or may represent different directions that are not perpendicular to one another. Here, a direction in the x-axis direction may be referred to as +x direction, a direction opposite to the x-axis direction may be referred to as −x direction, a direction in the y-axis direction may be referred to as +y direction, a direction opposite to the y-axis direction may be referred to as −y direction, a direction in the z-axis direction may be referred to as +z direction, and a direction opposite to the z-axis direction may be referred to as −z direction.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Hereinafter, embodiments of the disclosure will be described in more detail with reference to the accompanying drawings.

FIG. 1 is a plan view schematically illustrating a display apparatus according to an embodiment.

As shown in FIG. 1, an embodiment of the display apparatus may include a display panel 10, a flexible printed circuit board 20, and a printed circuit board 40. In such an embodiment, the display apparatus may further include various other elements, such as an integrated circuit chip 30.

The display panel 10 may include a display region DA and a non-display region NA. The display region DA may include a portion in which an image is displayed, and the non-display region NA around the display region DA may include a portion in which circuits configured to generate signals to be applied to the display region DA and/or signal lines configured to transmit signals to the display region DA are arranged. The non-display region NA may surround the display region DA. In FIG. 1, a boundary of the display region DA and the non-display region NA is indicated by dotted lines.

Pixels PX may be arranged in the display region DA of the display panel 10. Signal lines, such as a first scan line 121, a second scan line 122, a data line 171, a driving voltage line 172, a common voltage line 173, and/or an initialization voltage line 174, may be arranged in the display region DA. Each of the first scan line 121 and the second scan line 122 may extend in approximately a first direction (an x-axis direction). Each of the data line 171, the driving voltage line 172, the common voltage line 173, and the initialization voltage line 174 may extend in approximately a second direction (a y-axis direction). The second direction may cross the first direction. However, the disclosure is not limited thereto. In an alternative embodiment, for example, at least one selected from the driving voltage line 172, the common voltage line 173, and the initialization voltage line 174 may have a mesh structure including a portion extending in approximately the first direction (the x-axis direction) and the other portion extending in approximately the second direction (the y-axis direction).

Each of the pixels PX may be connected to the first scan line 121, the second scan line 122, the data line 171, the driving voltage line 172, the common voltage line 173, and/or the initialization voltage line 174, and receive a first scan signal, a second scan signal, a data voltage, a driving voltage, a common voltage, and/or a driving voltage from the signal lines. The pixel PX may include a light emitting element, such as a light-emitting diode.

Touch electrodes may be arranged in the display panel 10 of the display apparatus to detect a touch by a user's finger or the like.

A first connection portion CP1, a second connection portion CP2, a third connection portion CP3, and a fourth connection portion CP4, in which connection lines configured to transmit signals from the outside to first lines of the display panel 10 are arranged, may be in the non-display region NA of the display panel 10. The first connection portion CP1, the second connection portion CP2, the third connection portion CP3, and the fourth connection portion CP4 may be apart from each other along an one edge (or an edge extending in the x-axis direction) of the display panel 10.

A first end of the flexible printed circuit board 20 may be connected to the first connection portion CP1, the second connection portion CP2, the third connection portion CP3, and the fourth connection portion CP4. Accordingly, second lines, each extending in a direction to the first end of the flexible printed circuit board 20, may be electrically connected to the first lines of the display panel 10 via the connection lines. Because the first connection portion CP1, the second connection portion CP2, the third connection portion CP3, and the fourth connection portion CP4 are apart from each other, each of the first connection portion CP1, the second connection portion CP2, the third connection portion CP3, and the fourth connection portion CP4 may be connected to a corresponding first end of the flexible printed circuit board 20. Alternatively, a single flexible printed circuit board 20 may be connected to the first connection portion CP1, the second connection portion CP2, the third connection portion CP3, and the fourth connection portion CP4.

A driving unit configured to generate and/or process various signals for driving the display panel 10 may be in the non-display region NA of the display panel 10. The driving unit may include a data driving unit, a gate driving unit, and a signal controller, where the data driving unit transmits a data signal to the data line 171, the gate driving unit transmits a gate signal to the first scan line 121 and the second scan line 122, and the signal controller controls the data driving unit and the gate driving unit. A data signal or the like may be transmitted to the pixels PX at a certain timing based on a scan signal generated by the gate driving unit.

The gate driving unit may be integrated in the display panel 10, and may be located at at least one side of the display region DA. The data driving unit may be in the same form as the integrated circuit chip 30. The integrated circuit chip 30 may be mounted on the flexible printed circuit board 20. Signals output from the integrated circuit chip 30 may be transmitted to the first lines of the display panel 10, which are connected to the connection lines, via the second lines of the flexible printed circuit board 20, which are also connected to the connection lines.

The display apparatus may include a plurality of integrated circuit chips 30, and one integrated circuit chip 30 may be mounted on each flexible printed circuit board 20. In an alternative embodiment, the integrated circuit chips 30 may be mounted in the non-display region NA of the display panel 10. In such an embodiment, the integrated circuit chips 30 may be between the display region DA and each of the first connection portion CP1, the second connection portion CP2, the third connection portion CP3, and the fourth connection portion CP4.

A first output pad unit OP1, a second output pad unit OP2, a third output pad unit OP3, and a fourth output pad unit OP4 may be apart from each other at one edge (or an edge extending in the x-axis direction) of the printed circuit board 40. A second end of the flexible printed circuit board 20 is a portion on the opposite side of the first end of the flexible printed circuit board 20 and may be connected to the first output pad unit OP1, the second output pad unit OP2, the third output pad unit OP3, and the fourth output pad unit OP4 of the printed circuit board 40. Accordingly, the lines of the flexible printed circuit board 20 may be electrically connected to the output pads of the printed circuit board 40.

Because the first output pad unit OP1, the second output pad unit OP2, the third output pad unit OP3, and the fourth output pad unit OP4 are apart from each other, each of the first output pad unit OP1, the second output pad unit OP2, the third output pad unit OP3, and the fourth output pad unit OP4 may be connected to a corresponding second end of the flexible printed circuit board 20. Alternatively, the first output pad unit OP1, the second output pad unit OP2, the third output pad unit OP3, and the fourth output pad unit OP4 may be connected to a single flexible printed circuit board 20.

Each of the second lines extending in a direction to the first end of the flexible printed circuit board 20 may be electrically connected to a corresponding transfer pad located at the second end of the flexible printed circuit board 20.

In an embodiment, as described above, the integrated circuit chip 30 may output signals to be transmitted to the display region DA. In an embodiment, for example, the integrated circuit chip 30 may output a data voltage, a driving voltage, a common voltage, and/or an initialization voltage. A data voltage transfer line, a driving voltage transfer line, a common voltage transfer line, and/or an initialization voltage transfer line, which are respectively configured to apply a data voltage, driving voltage, common voltage, and/or initialization voltage output from the integrated circuit chip 30 to the data line 171, driving voltage line 172, common voltage line 173, and/or initialization voltage line 174 of the display region DA, may be in the non-display region NA. The integrated circuit chip 30 may also output signals for controlling the gate driving unit.

In an embodiment, the integrated circuit chip 30 may receive, from the printed circuit board 40, signals (e.g., image data and signals or power related thereto) that serve as a basis for generating the signals described above. In such an embodiment, signals of the printed circuit board 40 may be transferred to the integrated circuit chip 30 via the output pads of the printed circuit board 40 and the transfer pads of the flexible printed circuit board 20.

A processor and/or a memory may be in the printed circuit board 40. In an embodiment, for example, where the display apparatus is applied to a mobile communication terminal, the processor may be an application processor including a central processing device, a graphics processing device, and/or a modem. The flexible printed circuit board 20 may be bendable, and accordingly, the printed circuit board 40 may be on a rear surface (or a surface facing-z direction) of the display panel 10.

Figure 2:
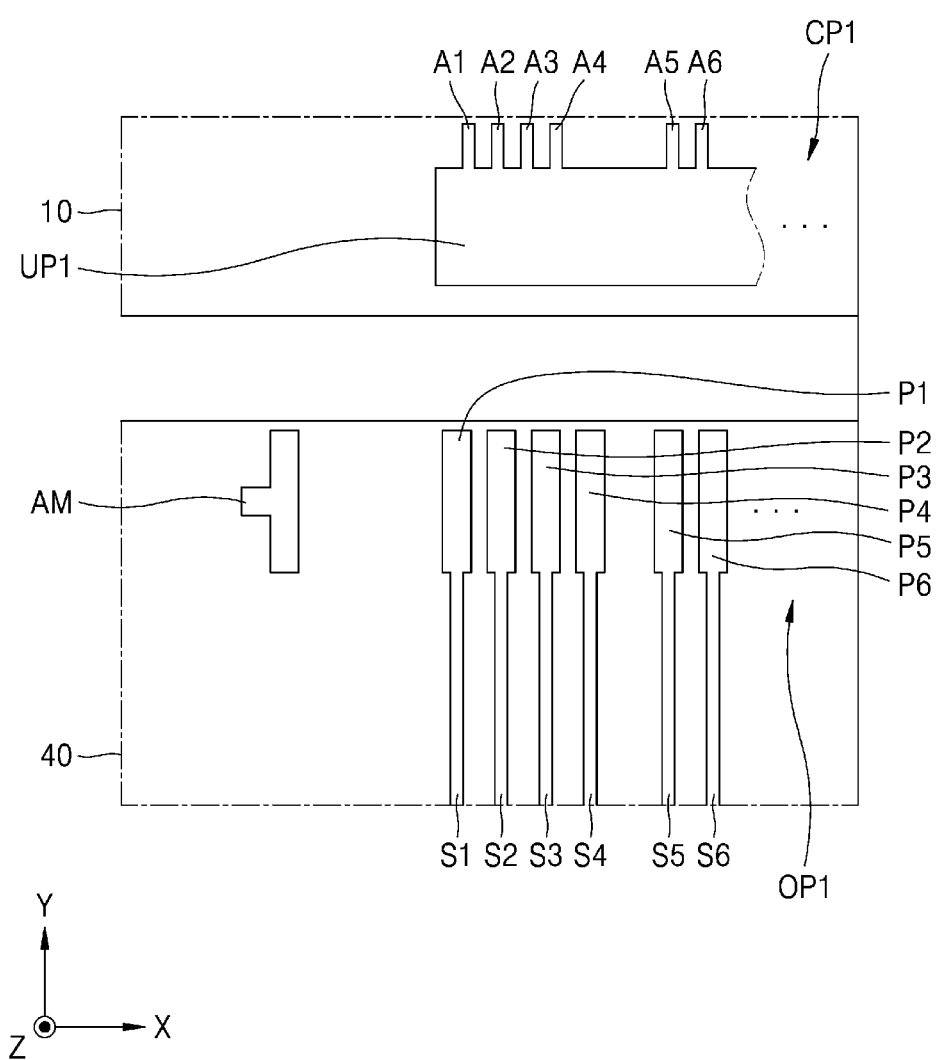
FIGS. 2 to 4 are plan views illustrating manufacturing processes of a display apparatus in region R in FIG. 1.
Figure 3:
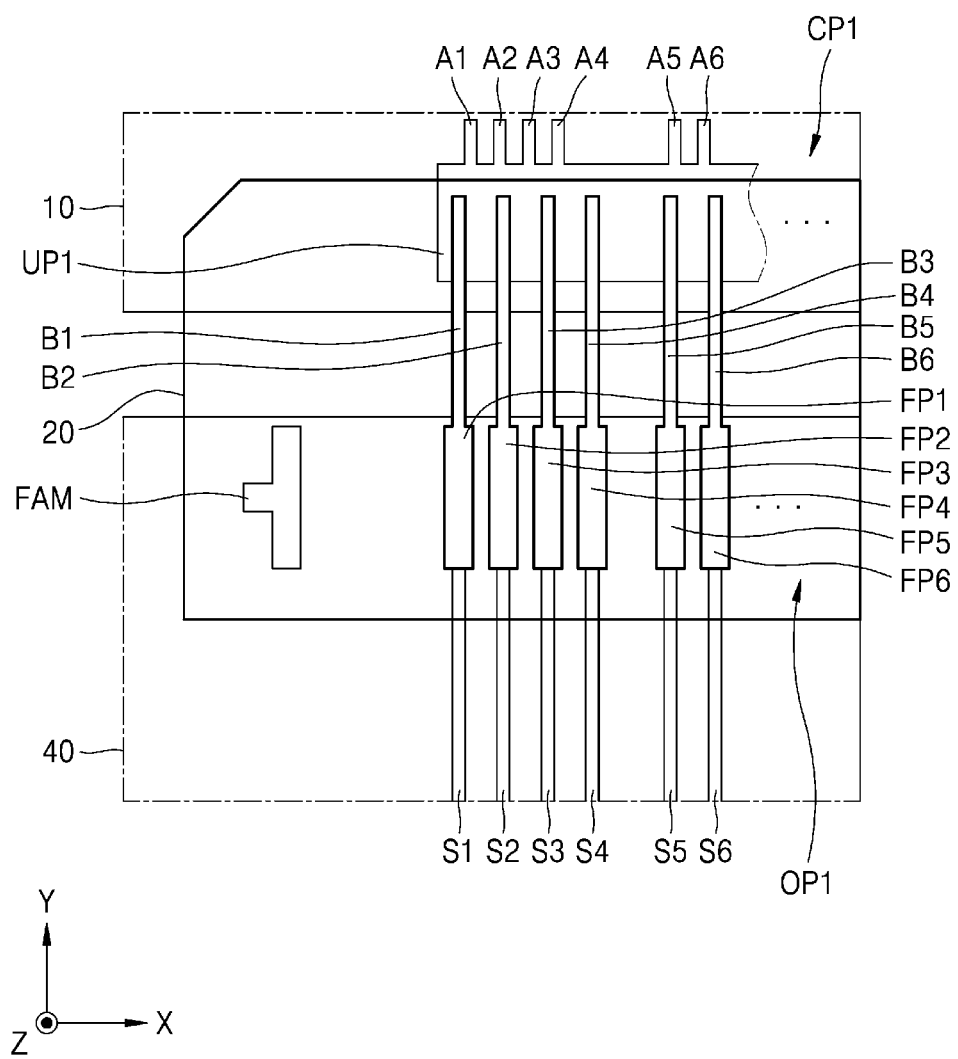
Figure 4:
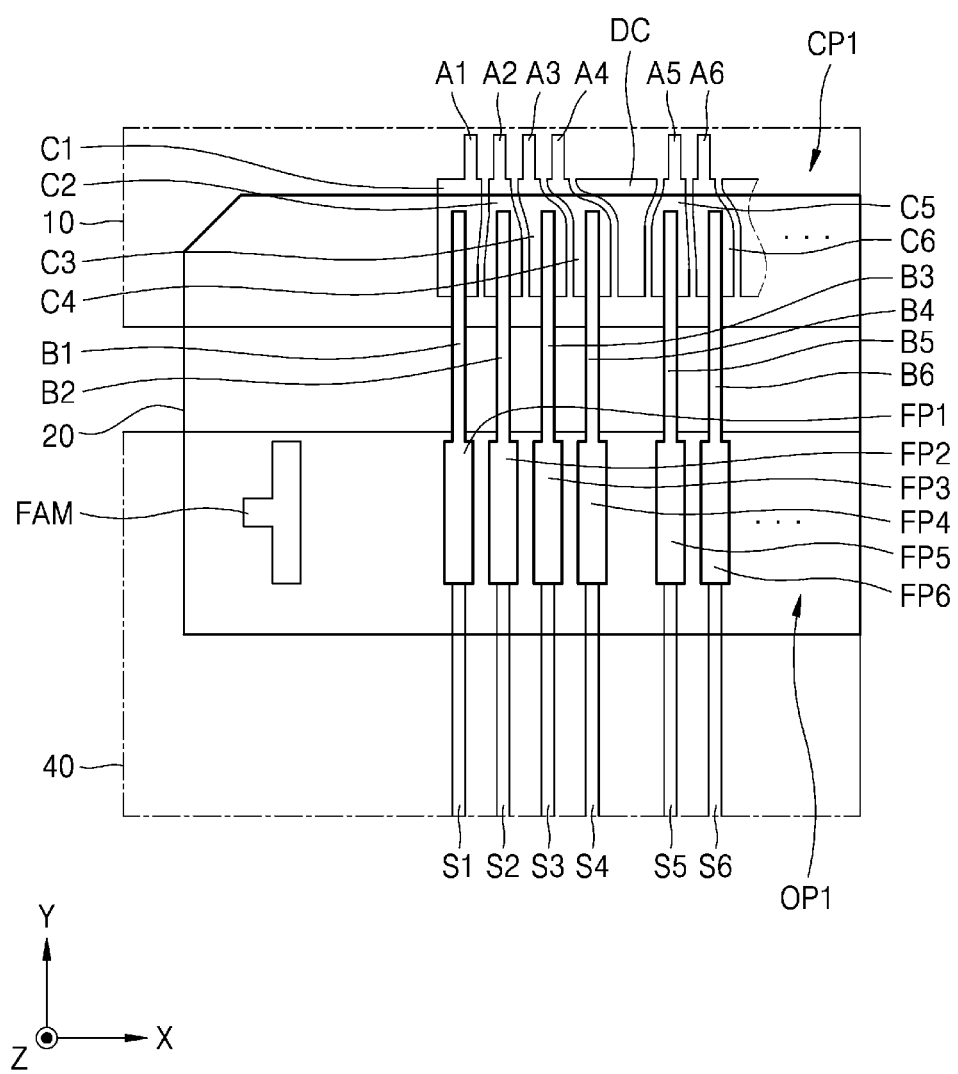
Figure 5:
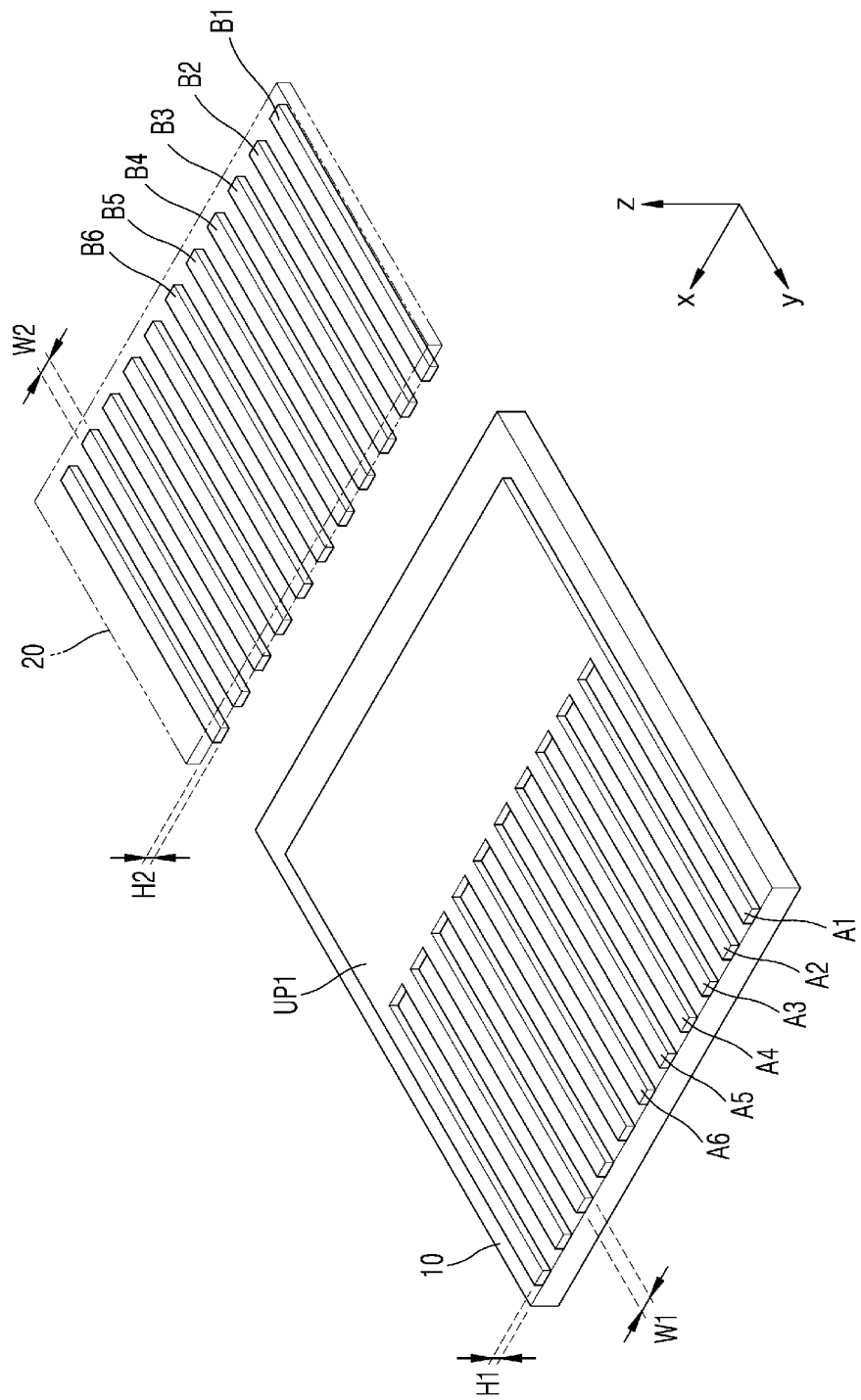
FIGS. 5 to 7 are perspective views illustrating manufacturing processes of a display apparatus, according to an embodiment.
Figure 6:
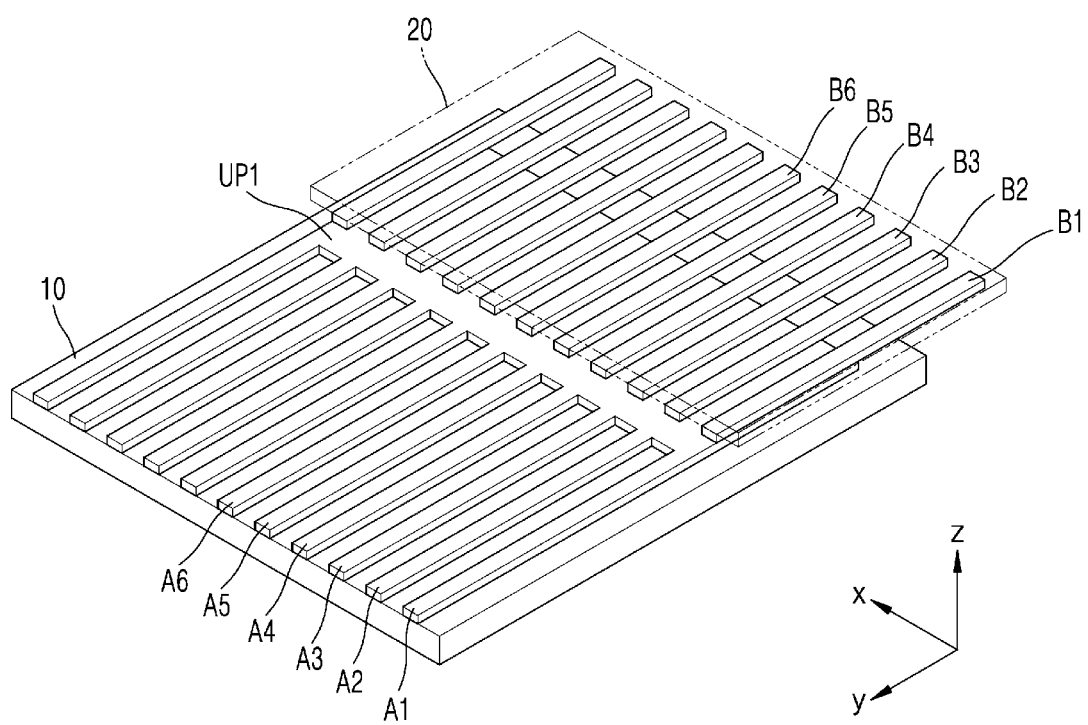
Figure 7:
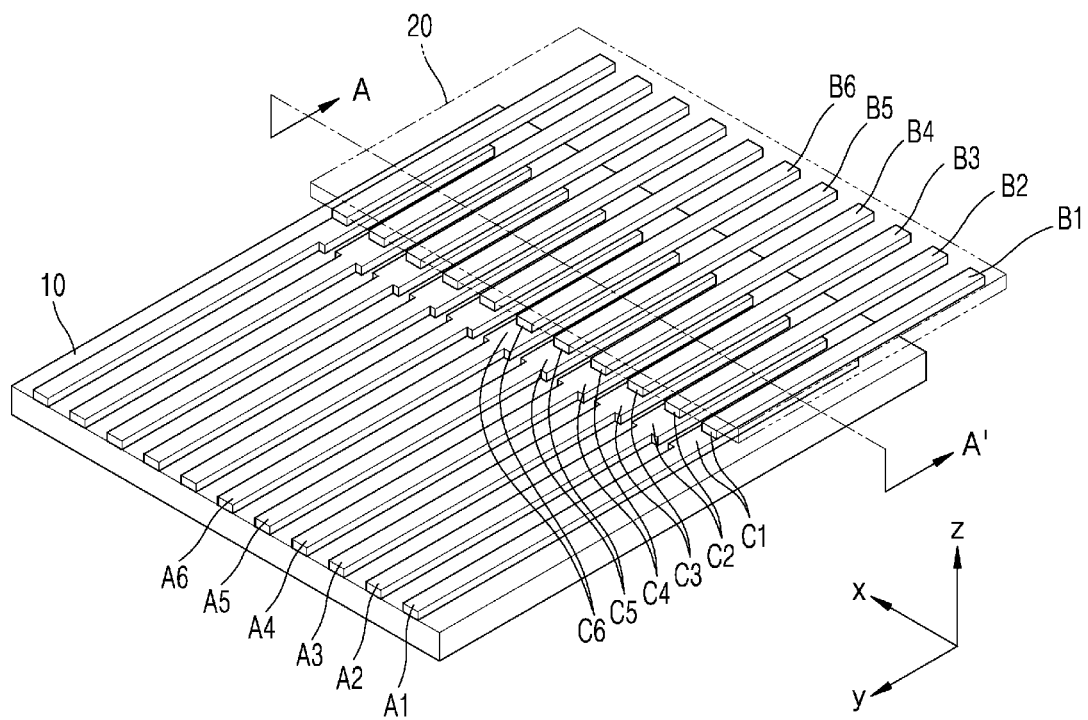
Figure 8:
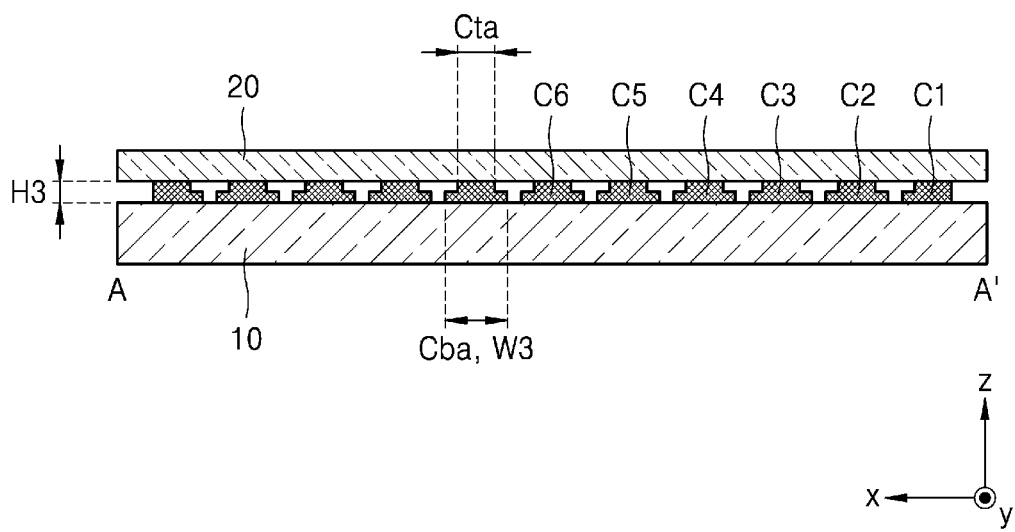
FIG. 8 is a cross-sectional view schematically illustrating a cross-section of the display apparatus in FIG. 7, taken along line A-A' in FIG. 7.

FIGS. 2 to 4 are plan views illustrating manufacturing processes of the display apparatus in region R in FIG. 1. FIG. 2 shows a region around the first connection portion CP1 of the display panel 10 and a region around the first output pad unit OP1 of the printed circuit board 40. FIGS. 5 to 7 are perspective views schematically illustrating the manufacturing processes shown in FIGS. 2 to 4, respectively, and FIG. 8 is a cross-sectional view schematically illustrating a cross-section of the display apparatus in FIG. 7, taken along line A-A' in FIG. 7.

As shown in FIG. 2, first lines A1, A2, A3, A4, A5, and A6 and a first integration pad UP1 may be provided on an upper surface (or a surface facing+z direction) of a substrate included in the display panel 10 in the non-display region NA outside of the display region DA. The first integration pad UP1 may be connected to each of ends of the first lines A1, A2, A3, A4, A5, and A6 and have a width (in the x-axis direction) greater than a width (in the x-axis direction) of each of the first lines A1, A2, A3, A4, A5, and A6. The first lines A1, A2, A3, A4, A5, and A6 and the first integration pad UP1 may be integrally formed as a single and indivisible body. In an embodiment, as shown in FIG. 5, the first lines A1, A2, A3, A4, A5, and A6 and the first integration pad UP1 are integrally formed as a single body and has a first height H1. In such an embodiment, as shown in FIG. 5, each of the first lines A1, A2, A3, A4, A5, and A6 has a first width W1.

The first lines A1, A2, A3, A4, A5, and A6 and the first integration pad UP1 may be simultaneously provided and include a same material as each other, when various electrodes and/or lines are formed. Further, each of the first lines A1, A2, A3, A4, A5, and A6 and the first integration pad UP1 may have a multi-layer structure. In an embodiment, for example, each of the first lines A1, A2, A3, A4, A5, and A6 and the first integration pad UP1 may have a three-layer structure of a titanium (Ti) layer, an aluminum (Al) layer, and another Ti layer, or may have a two-layer structure of a Ti layer and a copper (Cu) layer. Alternatively, each of the first lines A1, A2, A3, A4, A5, and A6 and the first integration pad UP1 may have a single-layer structure. Each of second lines B1, B2, B3, B4, B5, and B6 may have a three-layer structure of a Ti layer, an Al layer, and another Ti layer, or may have a two-layer structure of a Ti layer and a Cu layer.

Alternatively, each of the second lines B1, B2, B3, B4, B5, and B6 may have a single-layer structure.

Output pads P1, P2, P3, P4, P5, and P6 may be provided at one edge (or an edge extending in the x-axis direction) of the printed circuit board 40. Signal lines S1, S2, S3, S4, S5, and S6 configured to transmit various electrical signals may be connected to the output pads P1, P2, P3, P4, P5, and P6, respectively. The output pads P1, P2, P3, P4, P5, and P6 and the respective signal lines S1, S2, S3, S4, S5, and S6 may be integrally formed as a single and indivisible body. In an embodiment, an alignment mark AM may be included in the printed circuit board 40.

In an embodiment, the flexible printed circuit board 20 may be prepared as shown in FIG. 3. The second lines B1, B2, B3, B4, B5, and B6 may be on a lower surface (or a surface facing-z direction) of the flexible printed circuit board 20. Each of the second lines B1, B2, B3, B4, B5, and B6 may extend toward the first end of the flexible printed circuit board 20. In addition, transfer pads FP1, FP2, FP3, FP4, FP5, and FP6, which are respectively connected to the second lines B1, B2, B3, B4, B5, and B6 located on the lower surface (or a surface facing-z direction) of the flexible printed circuit board 20, may be at the second end of the flexible printed circuit board 20. The flexible printed circuit board 20 described above may be flexible. In an embodiment, as shown in FIG. 5, each of the second lines B1, B2, B3, B4, B5, and B6 has a second height H2. In such an embodiment, as shown in FIG. 5, each of the second lines B1, B2, B3, B4, B5, and B6 has a second width W2.

The flexible printed circuit board 20 may be aligned with respect to the display panel 10, as shown in FIGS. 3 and 6. In an embodiment, for example, the flexible printed circuit board 20 and the substrate of the display panel 10 may be located in a way such that an upper surface (a surface facing+z direction) of the first integration pad UP1 of the display panel 10 and lower surfaces (a surface facing-z direction) of the second lines B1, B2, B3, B4, B5, and B6 are in contact with each other. In such an embodiment, the upper surface (a surface facing+z direction) of the first integration pad UP1 of the display panel 10 and the lower surfaces (a surface facing-z direction) of the second lines B1, B2, B3, B4, B5, and B6 of the flexible printed circuit board 20 may be disposed to be in contact with each other, without a precise alignment between the first integration pad UP1 and the display panel 10.

In an embodiment, before or after the alignment, the flexible printed circuit board 20 and the printed circuit board 40 may be aligned with each other, as shown in FIG. 3. In such an embodiment, the flexible printed circuit board 20 and the printed circuit board 40 may be aligned with each other in a way such that lower surfaces (-z direction) of the transfer pads FP1, FP2, FP3, FP4, FP5, and FP6 of the flexible printed circuit board 20 are in contact with upper surfaces (+z direction) of the output pads P1, P2, P3, P4, P5, and P6 of the printed circuit board 40, respectively. In such an embodiment, the second end of the flexible printed circuit board 20 and the printed circuit board 40 may be bonded to each other at an accurate position by allowing an alignment mark FAM of the flexible printed circuit board 20 to coincide with the alignment mark AM of the printed circuit board 40. The flexible printed circuit board 20 and the printed circuit board 40 may be electrically connected to each other by, for example, an anisotropic conductive film (ACF) therebetween.

After the flexible printed circuit board 20 and the display panel 10 are aligned with each other, as described above, the first integration pad UP1 may be bonded to each of the second lines B1, B2, B3, B4, B5, and B6. Various methods may be used to bond the first integration pad UP1 to the second lines B1, B2, B3, B4, B5, and B6, and for example, metal-to-metal bonding may be used. In an embodiment, the metal-to-metal bonding may include eutectic bonding. In an embodiment, for example, in the eutectic bonding, when a pressure of 1.5 megapascal (MPa) is applied between the first integration pad UP1 and the second lines B1, B2, B3, B4, B5, and B6 at a temperature of 400° C., the first integration pad UP1 and the second lines B1, B2, B3, B4, B5, and B6 may be bonded to each other. By such bonding, the first integration pad UP1 and the second lines B1, B2, B3, B4, B5, and B6 may be integrally formed as a single and indivisible body.

Thereafter, a laser beam may be radiated onto the first integration pad UP1 so that portions of the first integration pad UP1 are removed. In an embodiment, by radiating a laser beam onto the first integration pad UP1, openings, which is formed through the first integration pad UP1 in a thickness direction and extend between the second lines B1, B2, B3, B4, B5, and B6 from a first end of the first integration pad UP1 in a direction (+y direction) to the first lines A1, A2, A3, A4, A5, and A6 to a second end of the first integration pad UP1 in a direction (-y direction) away from the first lines A1, A2, A3, A4, A5, and A6, may be provided. In an embodiment, for example, a first opening formed through the first integration pad UP1 in the thickness direction and extending from the first end of the first integration pad UP1 to the second end of the first integration pad UP1 may be provided at one side (-x direction) of the second line B2, and a second opening formed through the first integration pad UP1 in the thickness direction and extending from the first end of the first integration pad UP1 to the second end of the first integration pad UP1 may be provided at the other side (+x direction) of the second line B2.

In an embodiment, when the laser beam is radiated onto the first integration pad UP1, the laser beam may be radiated from an upper portion (+z direction) of the flexible printed circuit board 20 via the flexible printed circuit board 20. In a case where the laser beam is radiated from a lower portion (-z direction) of the display panel 10 via the display panel 10, the display panel 10 may be damaged.

By the openings defined in the first integration pad UP1, connection lines C1, C2, C3, C4, C5, and C6 may be provided. The connection lines C1, C2, C3, C4, C5, and C6 may be defined as remaining portions of the first integration pad UP1 and portions of the second lines B1, B2, B3, B4, B5, and B6 overlapping the first integration pad UP1. Accordingly, the connection lines C1, C2, C3, C4, C5, and C6 may electrically connect the first lines A1, A2, A3, A4, A5, and A6 of the display panel 10 and the second lines B1, B2, B3, B4, B5, and B6 of the flexible printed circuit board 20, respectively.

As the resolution of a display apparatus has increased, a gap between the first lines A1, A2, A3, A4, A5, and A6 of the display panel 10 has significantly decreased. Thus, it may not be easy to provide pads connected to the first lines A1, A2, A3, A4, A5, and A6 and located on the display panel 10, provide the corresponding pads on the flexible printed circuit board 20, then accurately align the pads disposed on the display panel 10 and the pads disposed on the flexible printed circuit board 20 with each other, and electrically connect pads by an ACF, as in the related art. In addition, even when the pads disposed on the display panel 10 and the corresponding pads of the flexible printed circuit board 20 are accurately aligned with each other, a gap between the pads disposed on the display panel 10 is very small, and thus, a short may occur between pads adjacent to each other due to the ACF.

In embodiments of the method of manufacturing the display apparatus, as described above, the upper surface (+z direction) of the first integration pad UP1 of the display panel 10 and the lower surfaces (−z direction) of the second lines B1, B2, B3, B4, B5, and B6 of the flexible printed circuit board 20 are disposed to be in contact with each other, without precise alignment between the flexible printed circuit board 20 and the display panel 10. In such embodiments, because only specific portions of the first integration pad UP1 may be removed by a laser beam, which may be precisely controlled as to an radiation position, an radiation intensity, or the like, each of the first lines A1, A2, A3, A4, A5, and A6 of the display panel 10 may be electrically connected to a corresponding one of the second lines B1, B2, B3, B4, B5, and B6 of the flexible printed circuit board 20 in an accurate manner. Thus, a display apparatus in which a high-resolution image may be implemented may be implemented by the manufacturing method described above.

In embodiments of the display apparatus manufactured as described above, the connection lines C1, C2, C3, C4, C5, and C6 may be located in portions in which the substrate of the display panel 10 and the flexible printed circuit board 20 overlap each other, and the connection lines C1, C2, C3, C4, C5, and C6 may be between the substrate of the display panel 10 and the flexible printed circuit board 20. In such embodiments, one end (+y direction) of the connection lines C1, C2, C3, C4, C5, and C6 may be connected to the a corresponding one of the first lines A1, A2, A3, A4, A5, and A6, and the other end (−y direction) may be connected to a corresponding one of the second lines B1, B2, B3, B4, B5, and B6.

In an embodiment, as shown in FIG. 4, a remaining portion DC, which is part of the remaining portion of the first integration pad UP1, but not of the connection lines C1, C2, C3, C4, C5, and C6, may be present. In such an embodiment, as shown in FIG. 4, the remaining portion DC is between the connection line C4 and the connection line C5. When a gap between the first line A4 and the first line A5 is large, the remaining portion DC may be on the display panel 10.

As described above, the first integration pad UP1 having the first height H1 and the second lines B1, B2, B3, B4, B5, and B6, each having the second height H2, may be bonded to each other. In the bonding process, a portion of the second lines B1, B2, B3, B4, B5, and B6 and a portion of the first integration pad UP1 may be melted. As a result, as shown in FIG. 8, each of the connection lines C1, C2, C3, C4, C5, and C6 has a third width W3 and a third height H3, and the third height H3 may be greater than each of the first height H1 and the second height H2, but may be less than a sum of the first height H1 and the second height H2.

In an embodiment, upper portions (+z direction) of the connection lines C1, C2, C3, C4, C5, and C6 may be part of the second lines B1, B2, B3, B4, B5, and B6 before bonding. Accordingly, upper surfaces (+z direction) of the connection lines C1, C2, C3, C4, C5, and C6 may be in contact with the lower surface (−z direction) of the flexible printed circuit board 20, as shown in FIG. 7. In an embodiment, the upper surfaces (+z direction) of the connection lines C1, C2, C3, C4, C5, and C6 may be disposed on a same plane as upper surfaces (+z direction) of the second lines B1, B2, B3, B4, B5, and B6. In such an embodiment, the upper surface (+z direction) of each of the connection lines C1, C2, C3, C4, C5, and C6 and an upper surface (+z direction) of a corresponding one of the second lines B1, B2, B3, B4, B5, and B6 may form a continuous surface.

In an embodiment, lower portions (−z direction) of the connection lines C1, C2, C3, C4, C5, and C6 may respectively include portions of the first integration pad UP1 integrally formed as a single and indivisible body with the first lines A1, A2, A3, A4, A5, and A6. Accordingly, as shown in FIG. 7, lower surfaces (−z direction) of the connection lines C1, C2, C3, C4, C5, and C6 and lower surfaces (−z direction) of the first lines A1, A2, A3, A4, A5, and A6 may be on a same plane. In such an embodiment, the lower surface (−z direction) of each of the connection lines C1, C2, C3, C4, C5, and C6 and a lower surface (−z direction) of the corresponding one of the first lines A1, A2, A3, A4, A5, and A6 may form a continuous surface.

In the manufacturing process, the first integration pad UP1 and the second lines B1, B2, B3, B4, B5, and B6 may be bonded to each other, as described above. In addition, by such bonding, the first integration pad UP1 and the second lines B1, B2, B3, B4, B5, and B6 may be integrally formed as a single and indivisible body. Accordingly, each of the first lines A1, A2, A3, A4, A5, and A6 may be integrally formed as a single and indivisible body with a corresponding one of the second lines B1, B2, B3, B4, B5, and B6 and a corresponding one of the connection lines C1, C2, C3, C4, C5, and C6.

In an embodiment, as described above with reference to FIGS. 4 and 7, by radiating a laser beam onto the first integration pad UP1, openings formed through the first integration pad UP1 in a thickness direction and extending between the second lines B1, B2, B3, B4, B5, and B6 from the first end of the first integration pad UP1 in the direction (+y direction) to the first lines A1, A2, A3, A4, A5, and A6 to the second end of the first integration pad UP1 in a direction (−y direction) away from the first lines A1, A2, A3, A4, A5, and A6 may be provided. In such an embodiment, a width (an x-axis direction) of each of the openings may be less than a gap between the second lines B1, B2, B3, B4, B5, and B6. The reason is that a portion of the first integration pad UP1 is precisely removed by a laser beam. Accordingly, in the connection lines C1, C2, C3, C4, C5, and C6, as shown in FIGS. 7 and 8, an area Cba of a lower surface may be greater than an area Cta of an upper surface. In such an embodiment, each of the connection lines C1, C2, C3, C4, C5, and C6 may have a bent side surface, as shown in FIGS. 7 and 8.

In an embodiment, as described above with reference to FIGS. 4 and 7, by radiating a laser beam onto the first integration pad UP1, openings formed through the first integration pad UP1 in a thickness direction and extending between the second lines B1, B2, B3, B4, B5, and B6 from the first end of the first integration pad UP1 in the direction (+y direction) to the first lines A1, A2, A3, A4, A5, and A6 to the second end of the first integration pad UP1 in a direction (-y direction) away from the first lines A1, A2, A3, A4, A5, and A6 may be provided. In such an embodiment, the flexible printed circuit board 20 may hardly be damaged. The reason is that a focus of the radiated laser beam is on the first integration pad UP1, not inside the flexible printed circuit board 20. Although a portion of the first integration pad UP1 may be deformed due to heat generated in a process of removing a portion of the first integration pad UP1, the deformation may not undesirably affect the overall performance of the flexible printed circuit board 20.

Figure 9:
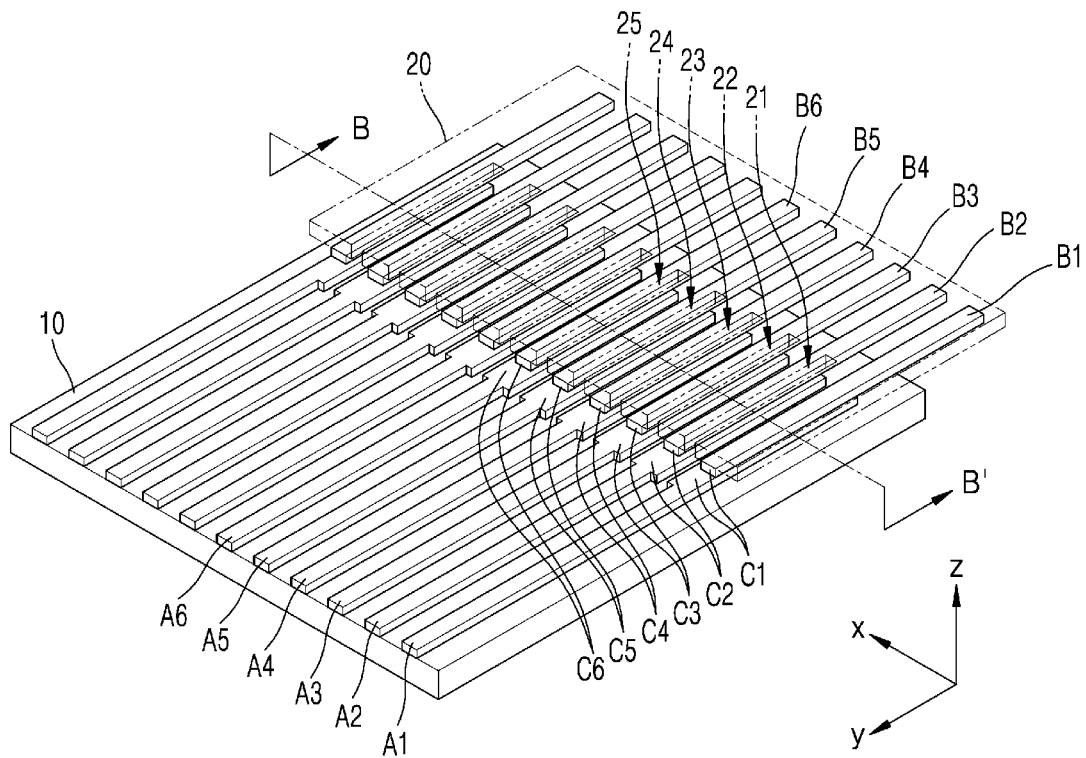
FIG. 9 is a perspective view schematically illustrating a portion of a display apparatus according to an embodiment.
Figure 10:
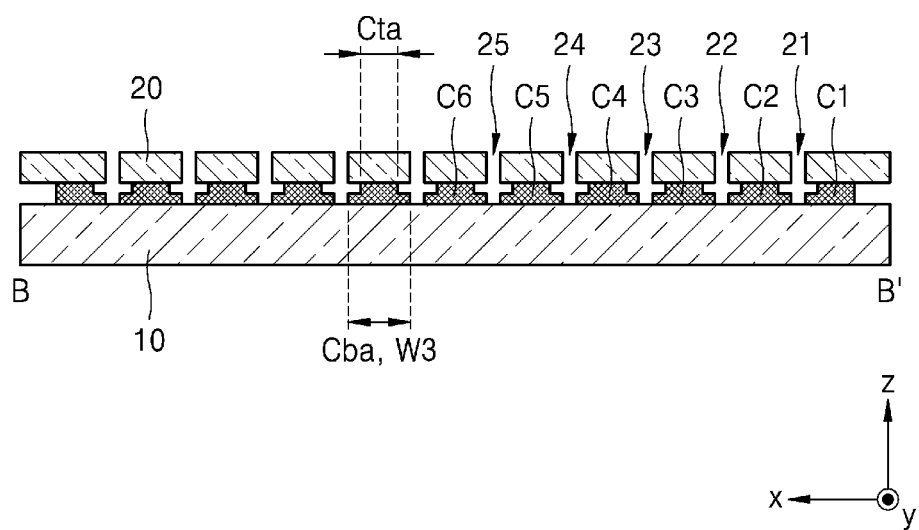
FIG. 10 is a cross-sectional view schematically illustrating a cross-section of the display apparatus in FIG. 9, taken along line B-B' in FIG. 9.

However, the disclosure is not limited thereto. In an alternative embodiment, for example, as shown in FIG. 9, which is a perspective view schematically illustrating a portion of a display apparatus according to an embodiment, and FIG. 10, which is a cross-sectional view schematically illustrating a cross-section of the display apparatus in FIG. 9, taken along line B-B' in FIG. 9, when a laser beam is radiated so that openings formed through the first integration pad UP1 in a thickness direction are provided in the first integration pad UP1, a portion of the flexible printed circuit board 20 may also be removed. In such an embodiment, portions of the flexible printed circuit board 20 corresponding between the connection lines C1, C2, C3, C4, C5, and C6 may be removed so that the flexible printed circuit board 20 may have cut-out portions 21, 22, 23, 24, and 25. In an embodiment, for example, the flexible printed circuit board 20 has a first cut-out portion 21 and a second cut-out portion 22, where the first cut-out portion 21 corresponds to one side (-x direction) of the connection line C2, and the second cut-out portion 22 corresponds to the other side (+x direction) of the connection line C2. In such an embodiment where the flexible printed circuit board 20 has the cut-out portions 21, 22, 23, 24, and 25, as described above, impurities that are generated when removing the portions of the first integration pad UP1 may be effectively removed to the outside of the flexible printed circuit board 20.

Each of the cut-out portions 21, 22, 23, 24, and 25 may extend in a direction (a y-axis direction) in which the connection lines C1, C2, C3, C4, C5, and C6 extend. In addition, the cut-out portions 21, 22, 23, 24, and 25 may expose side surfaces of the connection lines C1, C2, C3, C4, C5, and C6. In an embodiment, for example, the first cut-out portion 21 of the flexible printed circuit board 20 corresponding to one side (-x direction) of the connection line C2 may expose one side surface (-x direction) of the connection line C2, and the second cut-out portion 22 of the flexible printed circuit board 20 corresponding to the other side (+x direction) of the connection line C2 may expose the other side surface (+x direction) of the connection line C2.

in an embodiment, an insulating layer covering the cut-out portions 21, 22, 23, 24, and 25 of the flexible printed circuit board 20 and/or an upper surface of the flexible printed circuit board 20 may be provided. The insulating layer that fills the cut-out portions 21, 22, 23, 24, and 25 of the flexible printed circuit board 20 may prevent the side surfaces of the connection lines C1, C2, C3, C4, C5, and C6 from being oxidized by being in contact with oxygen or moisture in the air. The insulating layer may include a polymer resin, such as epoxy, acryl, and polyimide.

Figure 11:
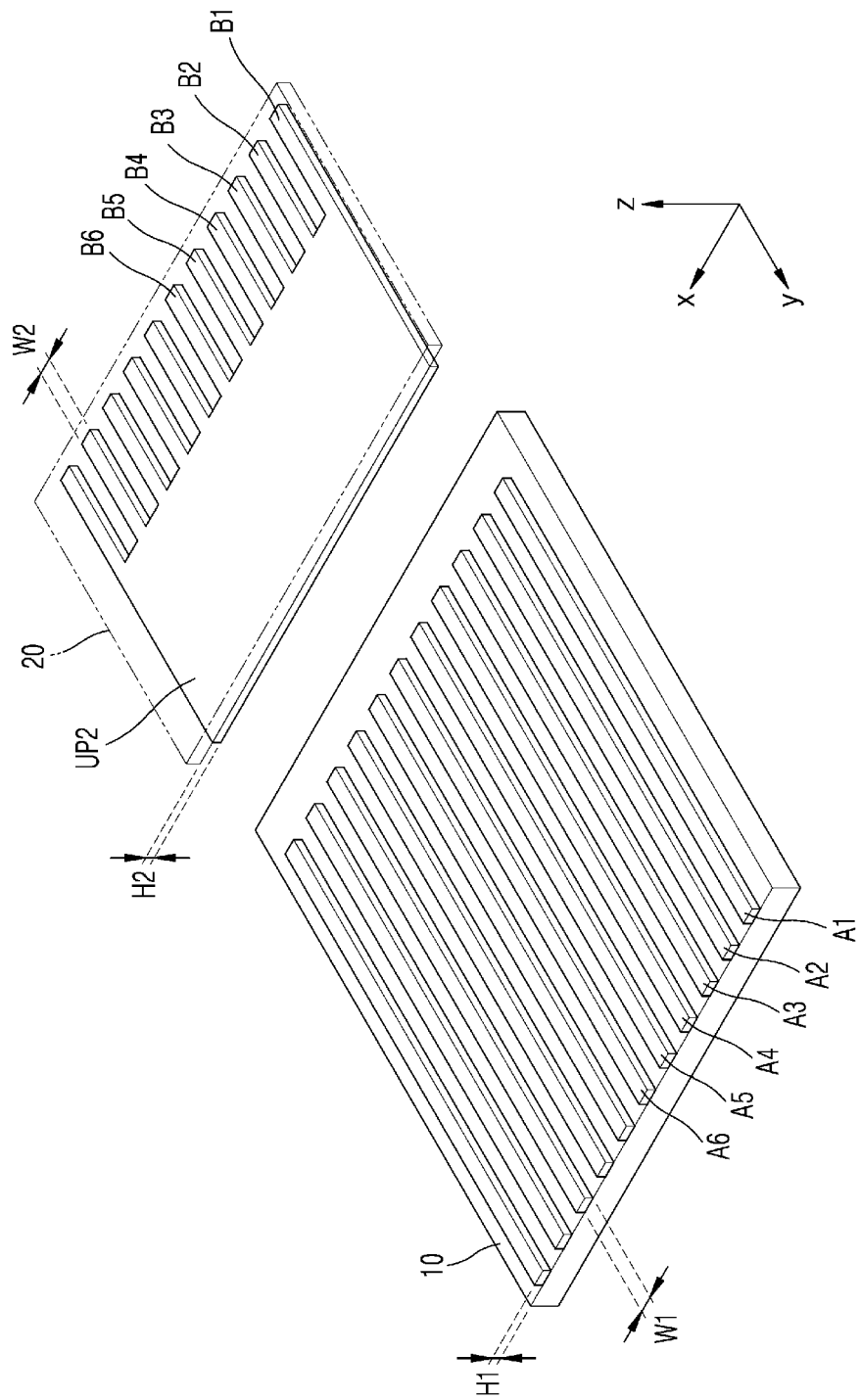
FIGS. 11 to 13 are perspective views illustrating manufacturing processes of a display apparatus, according to an embodiment.
Figure 12:
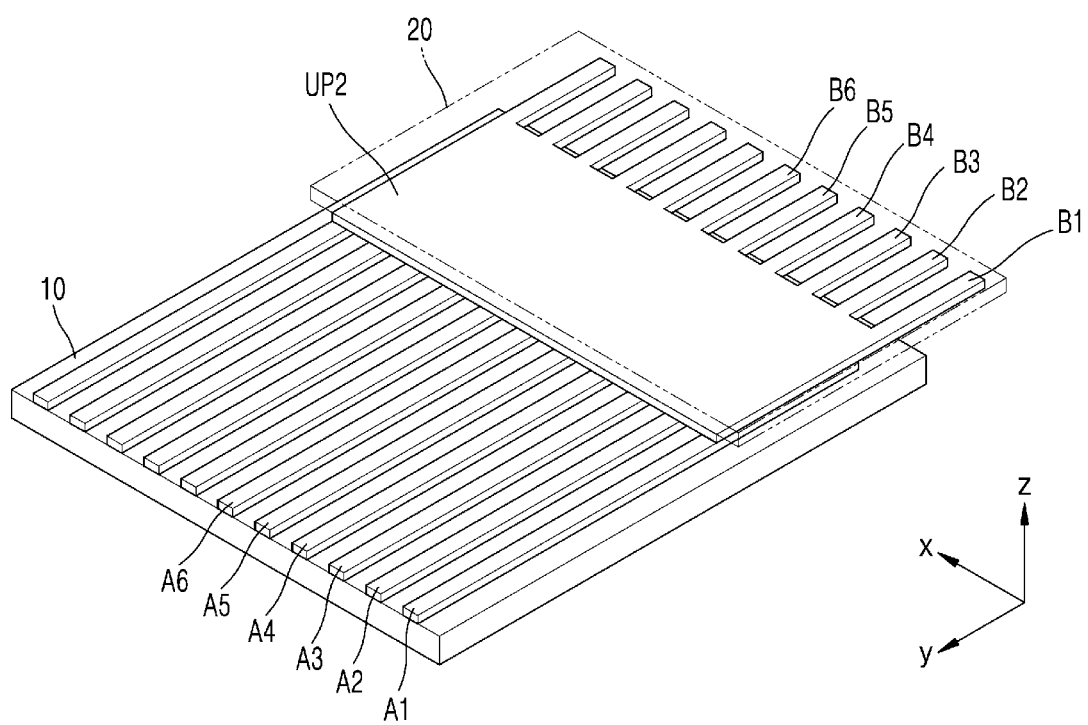
Figure 13:
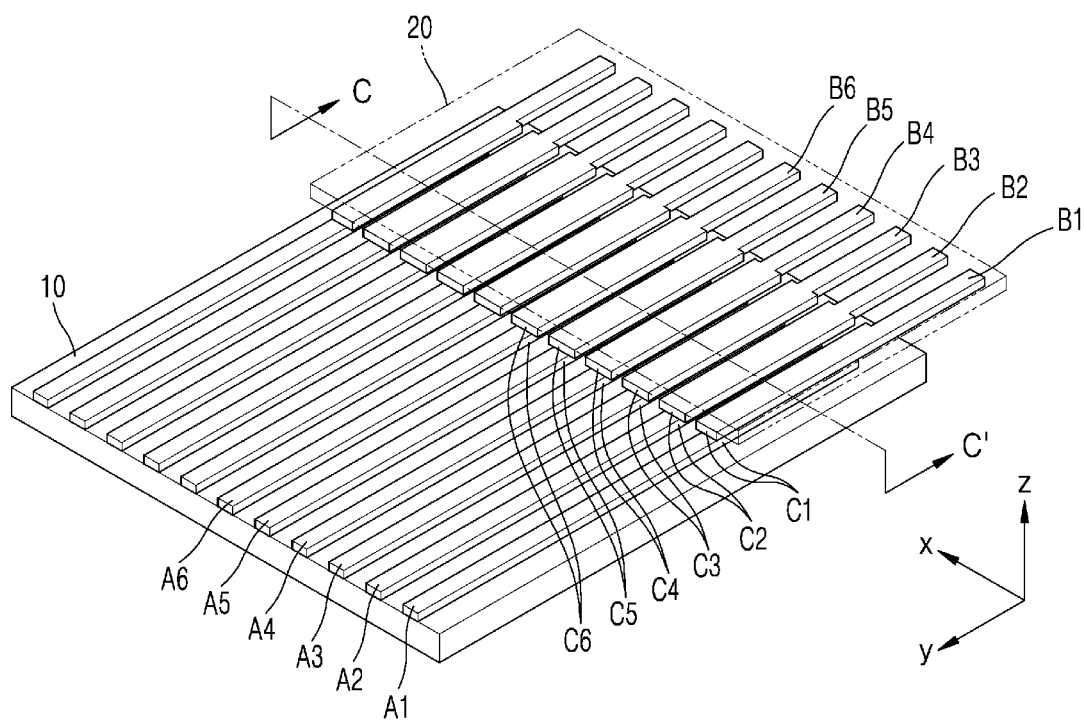
Figure 14:
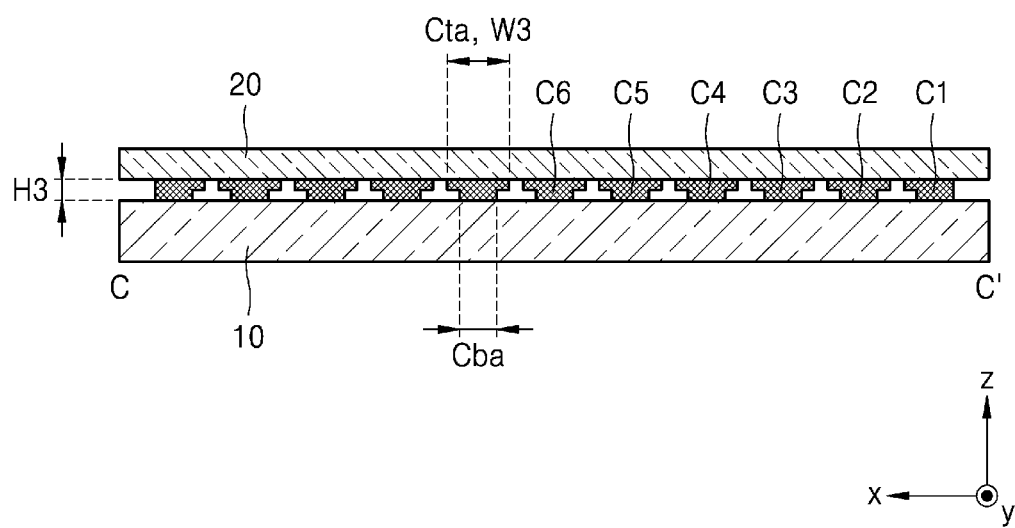
FIG. 14 is a cross-sectional view schematically illustrating a cross-section of the display apparatus in FIG. 13, taken along line C-C' in FIG. 13.

FIGS. 11 to 13 are perspective views illustrating manufacturing processes of a display apparatus, according to an embodiment, and FIG. 14 is a cross-sectional view schematically illustrating a cross-section of the display apparatus in FIG. 13, taken along line C-C' in FIG. 13. A method of manufacturing a display apparatus, shown in FIGS. 11 to 14 is substantially the same as the embodiments of the method of manufacturing the display apparatus described above, except for a location of an integration pad.

As shown in FIG. 11, in the method of manufacturing the display apparatus, according to an embodiment, the display panel 10 may include the first lines A1, A2, A3, A4, A5, and A6 on the upper surface (+z direction) of the substrate in the non-display region NA, the first lines A1, A2, A3, A4, A5, and A6, each having the first height H1. Each of the first lines A1, A2, A3, A4, A5, and A6 may have the first width W1 (in the x-axis direction). The flexible printed circuit board 20 may include the second lines B1, B2, B3, B4, B5, and B6 and a second integration pad UP2. The second integration pad UP2 may be connected to ends of the second lines B1, B2, B3, B4, B5, and B6 and have a width (in the x-axis direction) greater than the second width W2 of each of the second lines B1, B2, B3, B4, B5, and B6 (in the x-axis direction). The second lines B1, B2, B3, B4, B5, and B6 and the second integration pad UP2 may be integrally formed as a single body. In an embodiment, as shown in FIG. 11, the second lines B1, B2, B3, B4, B5, and B6 and the second integration pad UP2 are integrally formed as a single and indivisible body and have the second height H2.

The first lines A1, A2, A3, A4, A5, and A6 may be simultaneously provided and include the same material, when various electrodes and/or lines are provided in the display region DA. In addition, each of the first lines A1, A2, A3, A4, A5, and A6 may have a multi-layer structure, such as a three-layer structure of a Ti layer, an Al layer, and another Ti layer, or a two-layer structure of a Ti layer and a Cu layer. Alternatively, each of the first lines A1, A2, A3, A4, A5, and A6 may have a single-layer structure. Each of the second lines B1, B2, B3, B4, B5, and B6 and the second integration pad UP2 may also have a three-layer structure of a Ti layer, an Al layer, and another Ti layer, or a two-layer structure of a Ti layer and a Cu layer. Alternatively, each of the second lines B1, B2, B3, B4, B5, and B6 and the second integration pad UP2 may have a single-layer structure.

The flexible printed circuit board 20 described above may be aligned with the display panel 10, as shown in FIG. 12. In an embodiment, for example, the flexible printed circuit board 20 and the substrate of the display panel 10 may be positioned with respect to each other so that the upper surfaces (+z direction) of the first lines A1, A2, A3, A4, A5, and A6 of the display panel 10 and a lower surface (-z direction) of the second integration pad UP2 are in contact with each other. In such an embodiment, the upper surfaces (+z direction) of the first lines A1, A2, A3, A4, A5, and A6 of the display panel 10 and the lower surface (-z direction) of the second integration pad UP2 of the flexible printed circuit board 20 are disposed to be in contact with each other, without a very precise alignment between the flexible printed circuit board 20 and the display panel 10.

After the flexible printed circuit board 20 is aligned with the display panel 10 as described above, the first lines A1, A2, A3, A4, A5, and A6 and the second integration pad UP2 may be bonded to each other. Various methods may be used to bond the first lines A1, A2, A3, A4, A5, and A6 and the second integration pad UP2 to each other. In an embodiment, for example, metal-to-metal bonding, such as eutectic bonding, may be used. By such a bonding, the first lines A1, A2, A3, A4, A5, and A6 and the second integration pad UP2 may be integrally formed as a single body.

Thereafter, a laser beam may be radiated onto the second integration pad UP2 so that portions of the second integration pad UP2 are removed. For example, as shown in FIG. 13, by radiating the laser beam onto the second integration pad UP2, openings passing through the second integration pad UP2 in a thickness direction and extending between the first lines A1, A2, A3, A4, A5, and A6 from a second end of the second integration pad UP2 in a direction (−y direction) to the second lines B1, B2, B3, B4, B5, and B6 to a first end of the second integration pad UP2 in a direction (+y direction) away from the second lines B1, B2, B3, B4, B5, and B6 may be provided. In an embodiment, for example, a first opening formed through the second integration pad UP2 in a thickness direction and extending from the first end of the second integration pad UP2 to the second end of the second integration pad UP2 is provided at one side (−x direction) of the first line A2, and a second opening formed through the second integration pad UP2 in a thickness direction and extending from the first end of the second integration pad UP2 to the second end of the second integration pad UP2 is provided at the other side (+x direction) of the first line A2.

By the openings provided in the second integration pad UP2, the connection lines C1, C2, C3, C4, C5, and C6 may be provided. The connection lines C1, C2, C3, C4, C5, and C6 may be defined as remaining portions of the second integration pad UP2 and portions of the first lines A1, A2, A3, A4, A5, and A6 overlapping the second integration pad UP2. Accordingly, the connection lines C1, C2, C3, C4, C5, and C6 may electrically connect the first lines A1, A2, A3, A4, A5, and A6 of the display panel 10 and the second lines B1, B2, B3, B4, B5, and B6 of the flexible printed circuit board 20, respectively.

According to embodiments of the method of manufacturing the display apparatus described above, the upper surfaces (+z direction) of the first lines A1, A2, A3, A4, A5, and A6 of the display panel 10 and the lower surface (−z direction) of the second integration pad UP2 are disposed to be in contact with each other, without a very precise alignment between the flexible printed circuit board 20 and the display panel 10. In such an embodiment, because only specific portions of the second integration pad UP2 may be removed by a laser beam, which may be precisely controlled as to an radiation position, an radiation intensity, or the like, each of the first lines A1, A2, A3, A4, A5, and A6 of the display panel 10 may be electrically connected to the corresponding one of the second lines B1, B2, B3, B4, B5, and B6 of the flexible printed circuit board 20 in an accurate manner. According to embodiments of the manufacturing method described above, a display apparatus in which a high-resolution image is implemented may be implemented.

In an embodiment of a display apparatus manufactured as described above, the connection lines C1, C2, C3, C4, C5, and C6 may be in portions in which the substrate of the display panel 10 and the flexible printed circuit board 20 overlap each other, and the connection lines C1, C2, C3, C4, C5, and C6 may be between the substrate of the display panel 10 and the flexible printed circuit board 20. In such an embodiment, one end (+y direction) of each of the connection lines C1, C2, C3, C4, C5, and C6 may be connected to a corresponding one of the first lines A1, A2, A3, A4, A5, and A6, and the other end (−y direction) may be connected to a corresponding one of the second lines B1, B2, B3, B4, B5, and B6.

In an embodiment, as described above, the first lines A1, A2, A3, A4, A5, and A6 having the first height H1 and the second integration pad UP2 having the second height H2 may be bonded to each other. In the bonding process, the first lines A1, A2, A3, A4, A5, and A6 each having the first height H1 and a portion of the second integration pad UP2 having the second height H2 may be melted. As a result, as shown in FIG. 14, each of the connection lines C1, C2, C3, C4, C5, and C6 has a third height H3, and the third height H3 may be greater than each of the first height H1 and the second height H2, but may be less than a sum of the first height H1 and the second height H2.

In an embodiment, the upper portions (+z direction) of the connection lines C1, C2, C3, C4, C5, and C6 may include portions of the second integration pad UP2 that are integrally formed as a single and indivisible body with the second lines B1, B2, B3, B4, B5, and B6. Accordingly, as shown in FIG. 13, the upper surfaces (+z direction) of the connection lines C1, C2, C3, C4, C5, and C6 may be in contact with the lower surface (−z direction) of the flexible printed circuit board 20. Further, the upper surfaces (+z direction) of the connection lines C1, C2, C3, C4, C5, and C6 may be disposed on the same plane as the upper surfaces (+z direction) of the second lines B1, B2, B3, B4, B5, and B6. In addition, the upper surface (+z direction) of each of the connection lines C1, C2, C3, C4, C5, and C6 and an upper surface (+z direction) of a corresponding one of the second lines B1, B2, B3, B4, B5, and B6 may form a continuous surface.

In such an embodiment, the lower portions (−z direction) of the connection lines C1, C2, C3, C4, C5, and C6 may include portions of the first lines A1, A2, A3, A4, A5, and A6. Accordingly, as shown in FIG. 13, the lower surfaces (−z direction) of the connection lines C1, C2, C3, C4, C5, and C6 and the lower surfaces (−z direction) of the first lines A1, A2, A3, A4, A5, and A6 may be disposed on a same plane. In addition, the lower surface (−z direction) of each of the connection lines C1, C2, C3, C4, C5, and C6 and a lower surface (−z direction) of a corresponding one of the first lines A1, A2, A3, A4, A5, and A6 may form a continuous surface.

In an embodiment, as described above, the first lines A1, A2, A3, A4, A5, and A6 and the second integration pad UP2 may be bonded to each other in the manufacturing process. In an embodiment, by such a bonding, the first lines A1, A2, A3, A4, A5, and A6 and the second integration pad UP2 may be integrally formed as a single and indivisible body. Accordingly, each of the first lines A1, A2, A3, A4, A5, and A6 may be integrally formed as a single body with a corresponding one of the second lines B1, B2, B3, B4, B5, and B6 and a corresponding one of the connection lines C1, C2, C3, C4, C5, and C6.

In an embodiment, as described above with reference to FIG. 13, by radiating the laser beam onto the second integration pad UP2, openings formed through the second integration pad UP2 in a thickness direction and extending between the first lines A1, A2, A3, A4, A5, and A6 from the second end of the second integration pad UP2 in the direction (−y direction) to the second lines B1, B2, B3, B4, B5, and B6 to the first end of the second integration pad UP2 in a direction (+y direction) away from the second lines B1, B2, B3, B4, B5, and B6 may be provided. In such an embodiment, a width (the x-axis direction) of each of the openings may be less than a gap between the first lines A1, A2, A3, A4, A5, and A6. The reason is that a portion of the second integration pad UP2 is precisely removed by the laser beam. Accordingly, in each of the connection lines C1, C2, C3, C4, C5, and C6, as shown in FIGS. 13 and 14, an area Cta of an upper surface may be greater than an area Cba of a lower surface. In addition, each of the connection lines C1, C2, C3, C4, C5, and C6 may have a bent side surface, as shown in FIGS. 13 and 14.

In an embodiment, as described above with reference to FIG. 13, by radiating the laser beam onto the second integration pad UP2, openings formed through the second integration pad UP2 in a thickness direction and extending between the first lines A1, A2, A3, A4, A5, and A6 from the second end of the second integration pad UP2 in the direction (−y direction) to the second lines B1, B2, B3, B4, B5, and B6 to the first end of the second integration pad UP2 in a direction (+y direction) away from the second lines B1, B2, B3, B4, B5, and B6 may be provided. In such an embodiment, the flexible printed circuit board 20 may hardly be damaged. The reason is that a focus of the radiated laser beam is on the second integration pad UP2, not inside the flexible printed circuit board 20. Although a portion of the second integration pad UP2 may be deformed due to heat generated in a process of removing a portion of the second integration pad UP2, the deformation may not undesirably affect the overall performance of the flexible printed circuit board 20.

Figure 15:
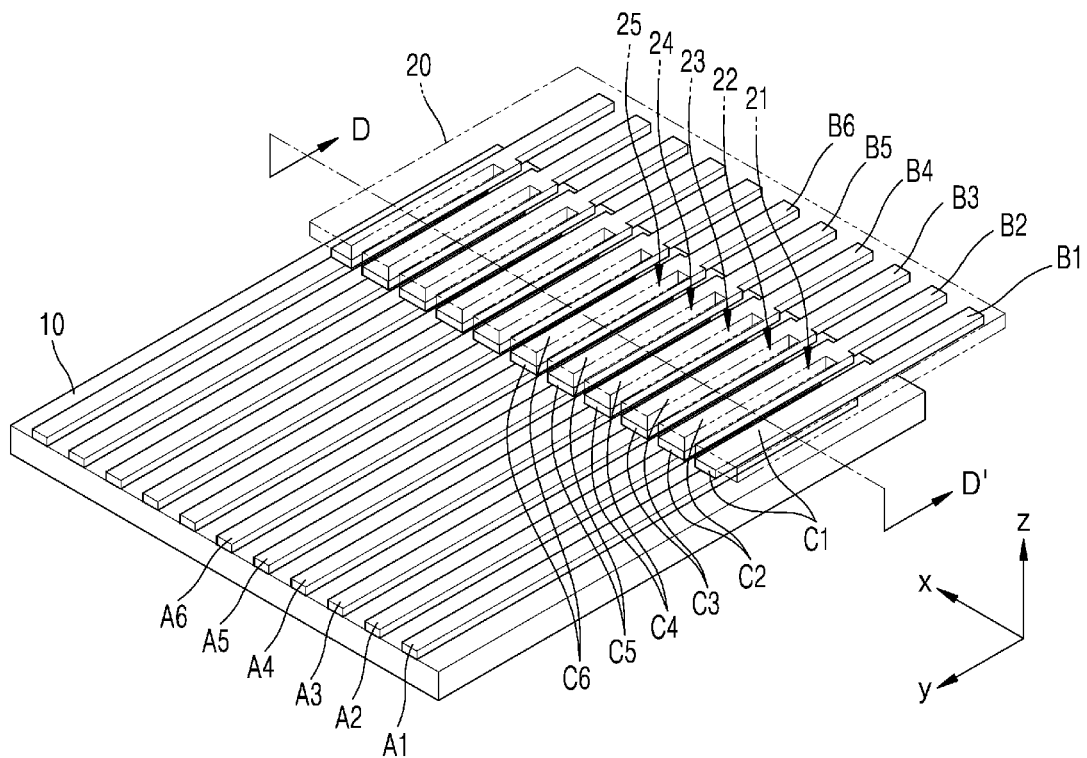
FIG. 15 is a perspective view schematically illustrating a portion of a display apparatus according to an embodiment.
Figure 16:
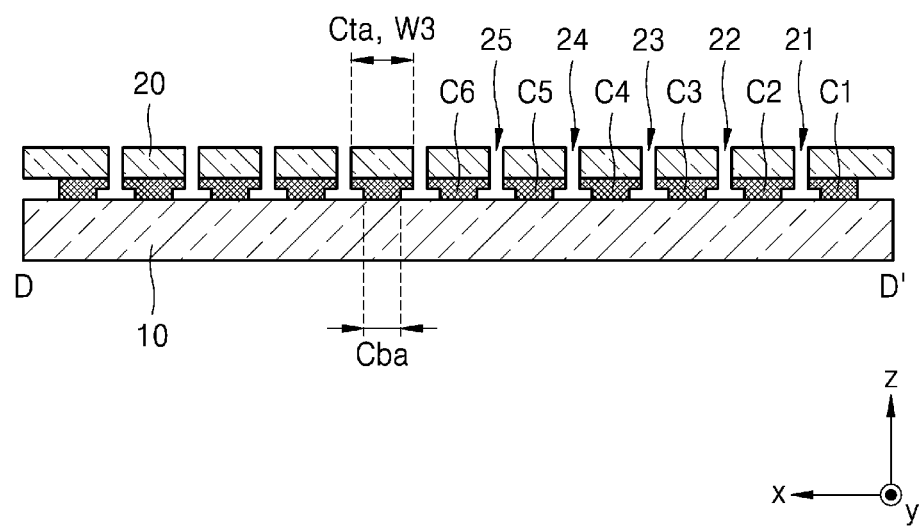
FIG. 16 is a cross-sectional view schematically illustrating a cross-section of the display apparatus in FIG. 15, taken along line D-D' in FIG. 15.

However, the disclosure is not limited thereto. In an embodiment, for example, as shown in FIG. 15, which is a perspective view schematically illustrating a portion of a display apparatus according to an embodiment, and FIG. 16, which is a cross-sectional view schematically illustrating a cross-section of the display apparatus in FIG. 15, taken along line D-D' in FIG. 15, when a laser beam is radiated so that openings formed through the second integration pad UP2 in a thickness direction are provided in the second integration pad UP2, a portion of the flexible printed circuit board 20 may also be removed. In such an embodiment, the flexible printed circuit board 20 may be removed along portions of the flexible printed circuit board 20 corresponding between the connection lines C1, C2, C3, C4, C5, and C6, so that the flexible printed circuit board 20 may have cut-out portions 21, 22, 23, 24, and 25. In an embodiment, for example, the flexible printed circuit board 20 has a first cut-out portion 21 and a second cut-out portion 22, where the first cut-out portion 21 corresponds to one side (−x direction) of the connection line C2, and the second cut-out portion 22 corresponds to the other side (+x direction) of the connection line C2. In such an embodiment where the flexible printed circuit board 20 has the cut-out portions 21, 22, 23, 24, and 25, as described above, impurities generated when removing the portions of the second integration pad UP2 may be quickly removed to the outside of the flexible printed circuit board 20.

Each of the cut-out portions 21, 22, 23, 24, and 25 may extend in a direction (y-axis direction) in which the connection lines C1, C2, C3, C4, C5, and C6 extend. In addition, the cut-out portions 21, 22, 23, 24, and 25 may expose side surfaces of the connection lines C1, C2, C3, C4, C5, and C6. In an embodiment, for example, the first cut-out portion 21 of the flexible printed circuit board 20 corresponding to one side (−x direction) of the connection line C2 may expose one side surface (−x direction) of the connection line C2, and the second cut-out portion 22 of the flexible printed circuit board 20 corresponding to the other side (+x direction) of the connection line C2 may expose the other side surface (+x direction) of the connection line C2.

In an embodiment, an insulating layer covering the cut-out portions 21, 22, 23, 24, and 25 of the flexible printed circuit board 20 and/or the upper surface of the flexible printed circuit board 20 may be provided. The insulating layer that fills the cut-out portions 21, 22, 23, 24, and 25 of the flexible printed circuit board 20 may prevent the side surfaces of the connection lines C1, C2, C3, C4, C5, and C6 from being oxidized by being in contact with oxygen or moisture in the air. The insulating layer may include a polymer resin, such as epoxy, acryl, and polyimide.

Figure 17:
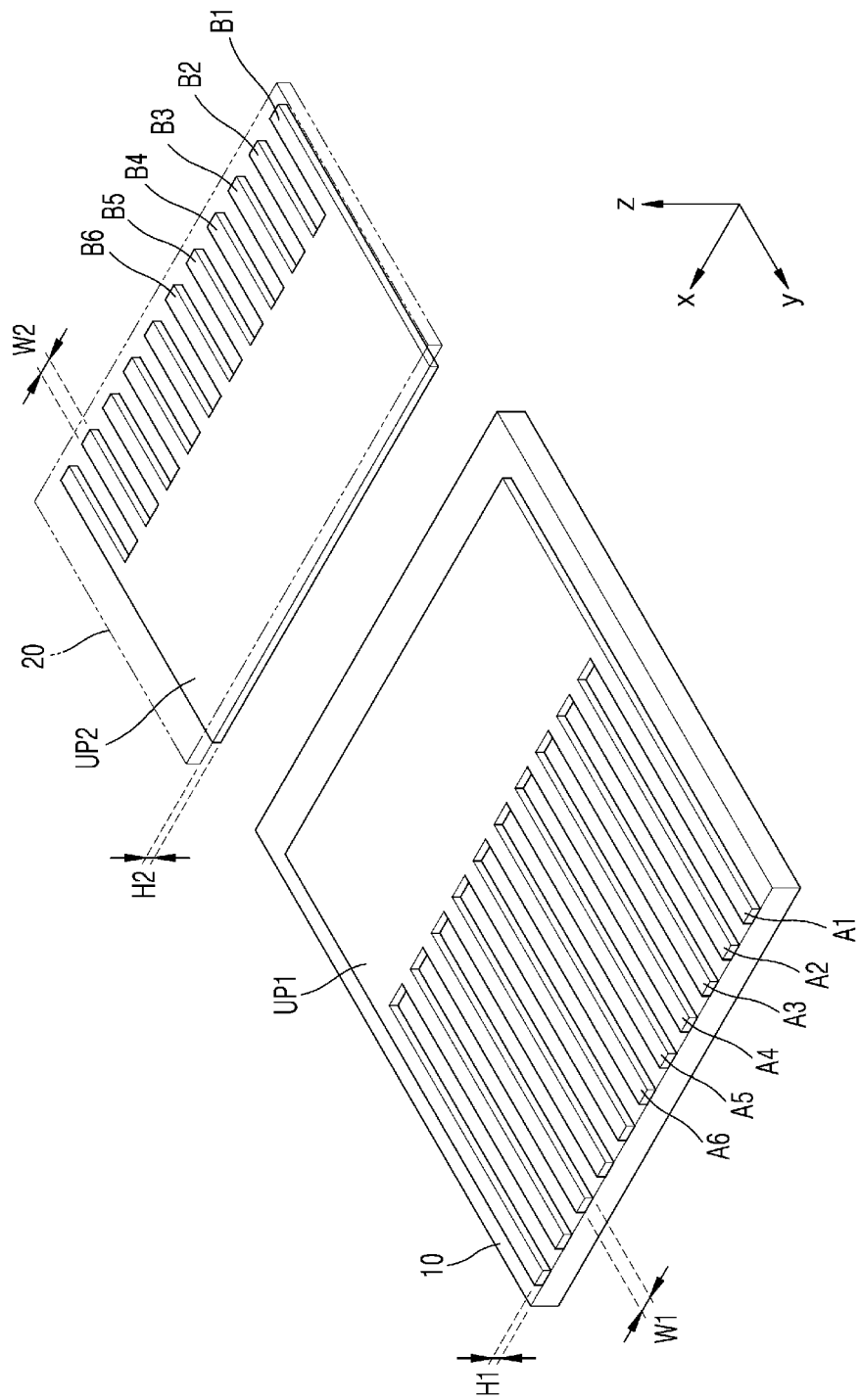
FIG. 17 is a perspective view illustrating a manufacturing process of a display apparatus, according to an embodiment.
Figure 18:
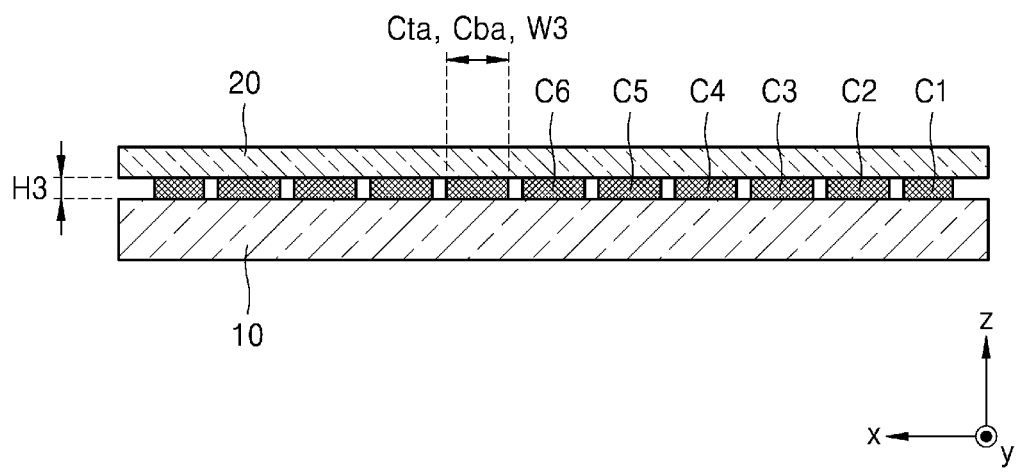
FIG. 18 is a cross-sectional view schematically illustrating a portion of a display apparatus manufactured according to the manufacturing process of FIG. 17.

FIG. 17 is a perspective view illustrating a manufacturing process of a display apparatus, according to an embodiment, and FIG. 18 is a cross-sectional view schematically illustrating a portion of a display apparatus manufactured by the manufacturing process. The method of manufacturing the display apparatus shown in FIGS. 17 and 18 is substantially the same as the embodiments of the method of manufacturing the display apparatus described above, except for a location of an integration pad.

According to an embodiment of the method of manufacturing the display apparatus, as shown in FIG. 17, the display panel 10 may include the first lines A1, A2, A3, A4, A5, and A6 and the first integration pad UP1 on the upper surface (+z direction) of the substrate in the non-display region NA outside the display region DA of the substrate. The first integration pad UP1 may be connected to ends of the first lines A1, A2, A3, A4, A5, and A6 and have a width (in the x-axis direction) greater than a width of each of the first lines A1, A2, A3, A4, A5, and A6 (in the x-axis direction). The first lines A1, A2, A3, A4, A5, and A6 and the first integration pad UP1 may be integrally formed as a single and indivisible body. In an embodiment, as shown in FIG. 17, the first lines A1, A2, A3, A4, A5, and A6 and the first integration pad UP1 are integrally formed as a single and indivisible body and have the first height H1. In such an embodiment, as shown in FIG. 17, each of the first lines A1, A2, A3, A4, A5, and A6 has the first width W1.

In an embodiment where various electrodes and/or lines are provided in the display area DA, the first lines A1, A2, A3, A4, A5, and A6 and the first integration pad UP1 may be simultaneously provided with each other and have a same material as each other. Further, each of the first lines A1, A2, A3, A4, A5, and A6 and the first integration pad UP1 has a multi-layer structure, for example, a three-layer structure of a titanium (Ti) layer, an aluminum (Al) layer, and another Ti layer, or a two-layer structure of a Ti layer and a copper (Cu) layer. Alternatively, each of the first lines A1, A2, A3, A4, A5, and A6 and the first integration pad UP1 may have a single-layer structure.

The flexible printed circuit board 20 may include the second lines B1, B2, B3, B4, B5, and B6 and the second integration pad UP2. The second integration pad UP2 may be connected to ends of the second lines B1, B2, B3, B4, B5, and B6 and have a width (in the x-axis direction) greater than the second width W2 of each of the second lines B1, B2, B3, B4, B5, and B6 (in the x-axis direction). The second lines B1, B2, B3, B4, B5, and B6 and the second integration pad UP2 may be integrally formed as a single and indivisible body. In an embodiment, as shown in FIG. 17, the second lines B1, B2, B3, B4, B5, and B6 and the second integration pad UP2 are integrally formed as a single and indivisible body and have the second height H2. Each of the second lines B1, B2, B3, B4, B5, and B6 and the second integration pad UP2 may also have a three-layer structure of a Ti layer, an Al layer, and another Ti layer, or a two-layer structure of a Ti layer and a Cu layer. Alternatively, each of the second lines B1, B2, B3, B4, B5, and B6 and the second integration pad UP2 may have a single-layer structure.

The flexible printed circuit board 20 and the substrate of the display panel 10 may be positioned so that the upper surface (+z direction) of the first integration pad UP1 of the display panel 10 and the lower surface (−z direction) of the second integration pad UP2 are in contact with each other. In such an embodiment, the upper surface (+z direction) of the first integration pad UP1 of the display panel 10 and the lower surface (−z direction) of the second integration pad UP2 of the flexible printed circuit board 20 may be disposed to be in contact with each other, without a very precise alignment between the flexible printed circuit board 20 and the display panel 10.

After the flexible printed circuit board 20 and the display panel 10 are aligned, as described above, the first integration pad UP1 and the second integration pad UP2 may be bonded to each other. Various methods may be used to bond the first integration pad UP1 and the second integration pad UP2 to each other, and for example, metal-to-metal bonding, such as eutectic bonding, may be used. By such a bonding, the first integration pad UP1 and the second integration pad UP2 may be integrally formed as a single body.

Thereafter, a laser beam may be radiated onto the first integration pad UP1 and the second UP2 so that portions of the first integration pad UP1 and the second integration pad UP2 are removed. In an embodiment, for example, by radiating the laser beam onto the first integration pad UP1 and the second integration pad UP2, openings passing through the first integration pad UP1 and the second integration pad UP2 in a thickness direction and extending from the first ends of the first and second integration pads UP1 and UP2 in the direction (+y direction) to the first lines A1, A2, A3, A4, A5, and A6 to the second ends of the first and second integration pads UP1 and UP2 in the direction (−y direction) to the second lines B1, B2, B3, B4, B5, and B6, may be provided. In an embodiment, for example, a portion between the first opening and the second opening that respectively pass through the first integration pad UP1 and the second integration pad UP2 in a thickness direction may connect the first line A2 and the second line B2 to each other.

By the openings respectively provided in the first integration pad UP1 and the second integration pad UP2, the connection lines C1, C2, C3, C4, C5, and C6 may be provided as shown in FIG. 18. The connection lines C1, C2, C3, C4, C5, and C6 may be defined as remaining portions of the first integration pad UP1 and the second integration pad UP2. Accordingly, the connection lines C1, C2, C3, C4, C5, and C6 may electrically connect the first lines A1, A2, A3, A4, A5, and A6 of the display panel 10 and the second lines B1, B2, B3, B4, B5, and B6 of the flexible printed circuit board 20, respectively.

According to embodiments of the method of manufacturing the display apparatus described above, the upper surface (+z direction) of the first integration pad UP1 of the display panel 10 and the lower surface (−z direction) of the second integration pad UP2 of the flexible printed circuit board 20 are in contact with each other, without a very precise alignment between the flexible printed circuit board 20 and the display panel 10. In such embodiments, only specific portions of the first integration pad UP1 and the second integration pad UP2 may be removed by a laser beam capable of being precisely controlled as to an radiation position, an radiation intensity, or the like, each of the first lines A1, A2, A3, A4, A5, and A6 of the display panel 10 may be electrically connected to a corresponding one of the second lines B1, B2, B3, B4, B5, and B6 of the flexible printed circuit board 20 in an accurate manner. According to embodiments of the manufacturing method described above, a high-resolution image may be implemented in the display apparatus.

In embodiments of a display apparatus manufactured as described above, the connection lines C1, C2, C3, C4, C5, and C6 may be located in portions in which the substrate of the display panel 10 and the flexible printed circuit board 20 overlap each other, and the connection lines C1, C2, C3, C4, C5, and C6 may be between the substrate of the display panel 10 and the flexible printed circuit board 20. In such embodiments, one end (+y direction) of each of the connection lines C1, C2, C3, C4, C5, and C6 may be connected to a corresponding one of the first lines A1, A2, A3, A4, A5, and A6, and the other end (−y direction) may be connected to a corresponding one of the second lines B1, B2, B3, B4, B5, and B6.

In embodiments, as described above, the first integration pad UP1 having the first height H1 and the second integration pad UP2 having the second height H2 may be bonded to each other. In a bonding process, the first integration pad UP1 having the first height H1 and a portion of the second integration pad UP2 having the second height H2 may be melted. As a result, as shown in FIG. 18, each of the connection lines C1, C2, C3, C4, C5, and C6 has the third height H3, and the third height H3 may be greater than each of the first height H1 and the second height H2, but may be less than a sum of the first height H1 and the second height H2.

In an embodiment, the upper portions (+z direction) of the connection lines C1, C2, C3, C4, C5, and C6 may include portions of the second integration pad UP2 that are integrally formed as a single and indivisible body with the second lines B1, B2, B3, B4, B5, and B6. Accordingly, the upper surfaces (+z direction) of the connection lines C1, C2, C3, C4, C5, and C6 may be in contact with the lower surface (−z direction) of the flexible printed circuit board 20. In such an embodiment, the upper surfaces (+z direction) of the connection lines C1, C2, C3, C4, C5, and C6 and the upper surfaces (+z direction) of the second lines B1, B2, B3, B4, B5, and B6 may be disposed on the same plane. In addition, the upper surface (+z direction) of each of the connection lines C1, C2, C3, C4, C5, and C6 and an upper surface (+z direction) of the corresponding one of the second lines B1, B2, B3, B4, B5, and B6 may form a continuous surface.

In an embodiment, the lower portions (−z direction) of the connection lines C1, C2, C3, C4, C5, and C6 may include portions of the first integration pad UP1 that are integrally formed as a single and indivisible body with the first lines A1, A2, A3, A4, A5, and A6. Accordingly, the lower surfaces (−z direction) of the connection lines C1, C2, C3, C4, C5, and C6 and the lower surfaces (−z direction) of the first lines A1, A2, A3, A4, A5, and A6 may be disposed on the same plane. In addition, the lower surface (−z direction) of each of the connection lines C1, C2, C3, C4, C5, and C6 and a lower surface (−z direction) of the corresponding one of the first lines A1, A2, A3, A4, A5, and A6 may form a continuous surface.

As described above, in embodiments of the manufacturing process, the first integration pad UP1 and the second integration pad UP2 may be bonded to each other, the first integration pad UP1 being integrally formed as a single and indivisible body with the first lines A1, A2, A3, A4, A5, and A6, and the second integration pad UP2 being integrally formed as a single and indivisible body with the second lines B1, B2, B3, B4, B5, and B6. In addition, by such a bonding, the first integration pad UP1 and the second integration pad UP2 may be integrally formed as a single body. Accordingly, each of the first lines A1, A2, A3, A4, A5, and A6 may be integrally formed as a single and indivisible body with the corresponding one of the second lines B1, B2, B3, B4, B5, and B6 and the corresponding one of the connection lines C1, C2, C3, C4, C5, and C6.

In an embodiment, as described above, by radiating a laser beam onto the first integration pad UP1 and the second integration pad UP2, openings formed through the first integration pad UP1 and the second integration pad UP2 in a thickness direction and extending from the first ends of the first integration pad UP1 and the second integration pad UP2 in the direction (+y direction) to the first lines A1, A2, A3, A4, A5, and A6 to the second ends of the first integration pad UP1 and the second integration pad UP2 in the direction (−y direction) to the second lines B1, B2, B3, B4, B5, and B6 may be provided. In such an embodiment, a width of each of the openings (the x-axis direction) may be less than a gap between the first lines A1, A2, A3, A4, A5, and A6 or a gap between the second lines B1, B2, B3, B4, B5, and B6. The reason is that the first integration pad UP1 and a portion of the second integration pad UP2 are precisely removed by the laser beam. Accordingly, in each of the connection lines C1, C2, C3, C4, C5, and C6, as shown in FIG. 18, an area Cta of an upper surface may be equal to an area Cba of a lower surface.

In an embodiment, as described above, by radiating the laser beam onto the first integration pad UP1 and the second integration pad UP2, the openings formed through the first integration pad UP1 and the second integration pad UP2 in a thickness direction and extend from the first ends of the first integration pad UP1 and the second integration pad UP2 in the direction (+y direction) to the first lines A1, A2, A3, A4, A5, and A6 to the second ends of the first integration pad UP1 and the second integration pad UP2 in the direction (−y direction) to the second lines B1, B2, B3, B4, B5, and B6, may be provided. In such an embodiment, the flexible printed circuit board 20 may hardly be damaged. The reason is that the focus of the radiated laser beam is on the first integration pad UP1 and the second integration pad UP2, not inside the flexible printed circuit board 20. Although a portion of the flexible printed circuit board 20 may be deformed due to heat generated in a process of removing a portion of the first integration pad UP1 and the second integration pad UP2, the deformation may not undesirably affect the overall performance of the flexible printed circuit board 20.

Figure 19:
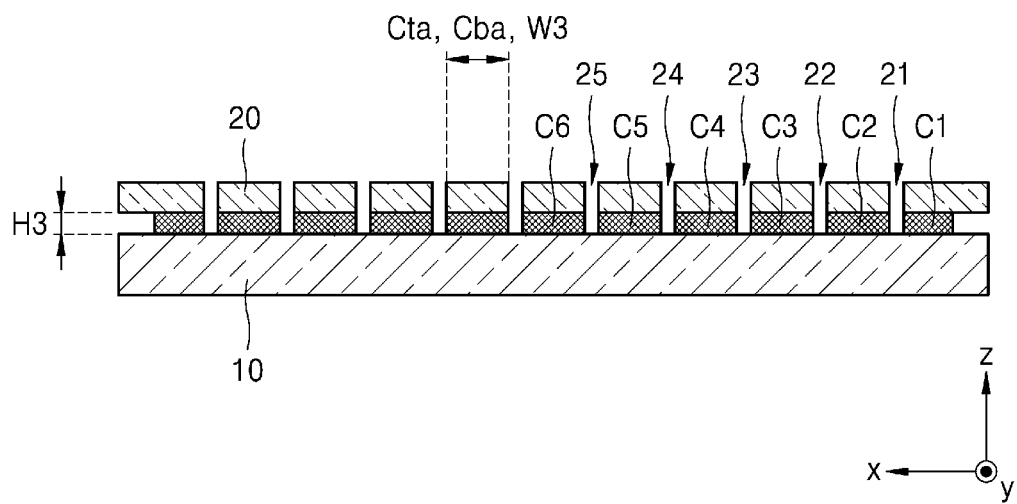
FIG. 19 is a cross-sectional view schematically illustrating a portion of a display apparatus according to an embodiment.

However, the disclosure is not limited thereto. In an embodiment, for example, as shown in FIG. 19, which is a cross-sectional view schematically illustrating a portion of the display apparatus according to an embodiment, when the laser beam is radiated so that openings are defined in the first integration pad UP1 and the second integration pad UP2, a portion of the flexible printed circuit board 20 may also be removed. In such an embodiment, the flexible printed circuit board 20 may be removed along portions of the flexible printed circuit board 20 corresponding between the connection lines C1, C2, C3, C4, C5, and C6, so that the flexible printed circuit board 20 may have cut-out portions 21, 22, 23, 24, and 25. For example, it may be understood that the flexible printed circuit board 20 has a first cut-out portion 21 and a second cut-out portion 22, where the first cut-out portion 21 corresponds to one side (−x direction) of the connection line C2, and the second cut-out portion 22 corresponds to the other side (+x direction) of the connection line C2. In such an embodiment where the flexible printed circuit board 20 has the cut-out portions 21, 22, 23, 24, and 25, as described above, impurities generated when removing portions of the first integration pad UP1 and the second integration pad UP2 may be quickly removed to the outside of the flexible printed circuit board 20.

Each of the cut-out portions 21, 22, 23, 24, and 25 may extend in a direction (y-axis direction) in which the connection lines C1, C2, C3, C4, C5, and C6 extend. In addition, the cut-out portions 21, 22, 23, 24, and 25 may expose side surfaces of the connection lines C1, C2, C3, C4, C5, and C6. In an embodiment, for example, the first cut-out portion 21 of the flexible printed circuit board 20 corresponding to one side (−x direction) of the connection line C2 may expose one side surface (−x direction) of the connection line C2, and the second cut-out portion 22 of the flexible printed circuit board 20 corresponding to the other side (+x direction) of the connection line C2 may expose the other side surface (+x direction) of the connection line C2.

In an embodiment, an insulating layer covering the cut-out portions 21, 22, 23, 24, and 25 of the flexible printed circuit board 20 and/or the upper surface of the flexible printed circuit board 20 may be provided. The insulating layer that fills the cut-out portions 21, 22, 23, 24, and 25 of the flexible printed circuit board 20 may prevent the side surfaces of the connection lines C1, C2, C3, C4, C5, and C6 from being oxidized by being in contact with oxygen or moisture in the air. The insulating layer may include a polymer resin, such as epoxy, acryl, and polyimide.

According to embodiments described above, a display apparatus in which a high-resolution image may be implemented, and a method of manufacturing the display apparatus may be implemented.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A method of manufacturing a display apparatus, the method comprising:
preparing a display panel including a first line and a first integration pad, wherein the first line has a first height and is disposed on an upper surface of a substrate in a non-display region outside a display region of the substrate, and the first integration pad is connected to an end of the first line and has a width greater than a width of the first line;
preparing a flexible printed circuit board including a second line on a lower surface thereof, wherein the second line has a second height;
disposing the flexible printed circuit board and the substrate in a way such that an upper surface of the first integration pad and a lower surface of the second line are in contact with each other;
bonding the first integration pad and the second line to each other; and
forming, by radiating a laser beam onto the first integration pad, a first opening and a second opening through the first integration pad in a thickness direction to extend along one side of the second line and another side of the second line from a first end of the first integration pad in a direction to the first line to a second end of the first integration pad in a direction away from the first line.

2. The method of claim 1, wherein the first integration pad and the second line are integrally formed as a single and indivisible body by the bonding.

3. A method of manufacturing a display apparatus, the method comprising:

preparing a display panel including a first line and a first integration pad, wherein the first line has a first height and is disposed on an upper surface of a substrate in a non-display region outside a display region of the substrate, and the first integration pad is connected to an end of the first line and has a width greater than a width of the first line;

preparing a flexible printed circuit board including a second line and a second integration pad, wherein the second line is disposed on a lower surface of the flexible printed circuit board and has a second height, and the second integration pad is connected to an end of the second line and has a width greater than a width of the second line;

disposing the flexible printed circuit board and the substrate in a way such that an upper surface of the first integration pad and a lower surface of the second integration pad are in contact with each other;

bonding the first integration pad and the second integration pad to each other; and forming, by radiating a laser beam onto the first integration pad and the second integration pad, a first opening and a second opening through the first integration pad and the second integration pad in a thickness direction to extend from first ends of the first integration pad and the second integration pad in a direction to the first line to second ends of the first integration pad and the second integration pad in a direction to the second line, wherein portions of the first integration pad and the second integration pad between the first opening and the second opening connect the first line and the second line to each other.

4. The method of claim 3, wherein the first integration pad and the second integration pad are integrally formed as a single and indivisible body by the bonding.

5. A method of manufacturing a display apparatus, the method comprising:

preparing a display panel including a first line on an upper surface of a substrate to be in a non-display region outside a display region of the substrate, the first line having a first height;

preparing a flexible printed circuit board including a second line and a second integration pad, wherein the second line is disposed on a lower surface of the flexible printed circuit board and has a second height, and the second integration pad is connected to an end of the second line and has a width greater than a width of the second line;

disposing the flexible printed circuit board and the substrate in a way such that a lower surface of the second integration pad and an upper surface of the first line are in contact with each other;

bonding the second integration pad and the first line to each other; and forming, by radiating a laser beam onto the second integration pad, a first opening and a second opening through the second integration pad in a thickness direction to extend along one side of the first line and another side of the first line from a second end of the second integration pad in a direction to the second line to a first end of the second integration pad in a direction away from the second line.

6. The method of claim 5, wherein the second integration pad and the first line are integrally formed as a single and indivisible body by the bonding.

* * * * *